United States Patent
Suwa et al.

(10) Patent No.: US 10,001,704 B2
(45) Date of Patent: Jun. 19, 2018

(54) PHOTOSENSITIVE RESIN COMPOSITION, METHOD OF MANUFACTURING CONDUCTIVE PATTERN, SUBSTRATE, ELEMENT, AND TOUCH PANEL

(71) Applicant: Toray Industries, Inc., Tokyo (JP)

(72) Inventors: Mitsuhito Suwa, Otsu (JP); Yuka Yamashiki, Otsu (JP)

(73) Assignee: Toray Industries, Inc. (JP)

( * ) Notice: Subject to any disclaimer, the term of this patent is extended or adjusted under 35 U.S.C. 154(b) by 0 days. days.

(21) Appl. No.: 15/303,816

(22) PCT Filed: Mar. 24, 2015

(86) PCT No.: PCT/JP2015/058860
§ 371 (c)(1),
(2) Date: Oct. 13, 2016

(87) PCT Pub. No.: WO2015/159655
PCT Pub. Date: Oct. 22, 2015

(65) Prior Publication Data
US 2017/0038682 A1    Feb. 9, 2017

(30) Foreign Application Priority Data

Apr. 16, 2014  (JP) .................................. 2014-084215

(51) Int. Cl.
| | | |
|---|---|---|
| *G03F 7/038* | (2006.01) |
| *G03F 7/039* | (2006.01) |
| *G03F 7/004* | (2006.01) |
| *G06F 3/041* | (2006.01) |
| *G03F 7/027* | (2006.01) |
| *G03F 7/16* | (2006.01) |
| *G03F 7/20* | (2006.01) |
| *G03F 7/26* | (2006.01) |
| *G03F 7/40* | (2006.01) |

(52) U.S. Cl.
CPC ............. *G03F 7/038* (2013.01); *G03F 7/004* (2013.01); *G03F 7/0045* (2013.01); *G03F 7/0047* (2013.01); *G03F 7/027* (2013.01); *G03F 7/039* (2013.01); *G03F 7/0388* (2013.01); *G03F 7/16* (2013.01); *G03F 7/168* (2013.01); *G03F 7/20* (2013.01); *G03F 7/26* (2013.01); *G03F 7/40* (2013.01); *G06F 3/041* (2013.01)

(58) Field of Classification Search
CPC ...... G03F 7/0045; G03F 7/0047; G03F 7/038; G03F 7/20; G03F 7/40; G03F 7/0388; G03F 7/0382; G03F 7/039; G03F 7/0392; G06F 3/041
USPC .......................... 430/270.1, 287.1, 320, 321
See application file for complete search history.

(56) References Cited

U.S. PATENT DOCUMENTS

2003/0099897 A1* 5/2003 Fedynyshyn ......... G03F 7/0047
430/192
2006/0073412 A1    4/2006 Lee et al.

FOREIGN PATENT DOCUMENTS

| | | |
|---|---|---|
| JP | 03-149267 | 6/1991 |
| JP | 2000-199954 A | 7/2000 |
| JP | 2001-089533 | 4/2001 |
| JP | 2002-311583 A | 10/2002 |
| JP | 2003-280195 A | 10/2003 |
| JP | 2004-110019 A | 4/2004 |
| JP | 2004-273254 A | 9/2004 |
| JP | 2006-108072 A | 4/2006 |
| JP | 2006-219693 A | 8/2006 |
| JP | 2007-138287 A | 6/2007 |
| JP | 2007-248516 A | 9/2007 |
| JP | 2008-34358 A | 2/2008 |
| JP | 2010-134003 A | 6/2010 |
| JP | 2010-189628 A | 9/2010 |
| JP | 2013-196997 A | 9/2013 |
| JP | 2013-222031 | 10/2013 |
| WO | 2009/041357 A1 | 4/2009 |
| WO | 2013/118875 A1 | 8/2013 |

OTHER PUBLICATIONS

Supplementary European Search Report dated Dec. 11, 2017, from corresponding European Application No. 15780242.2.

* cited by examiner

*Primary Examiner* — John A McPherson
(74) *Attorney, Agent, or Firm* — DLA Piper LLP (US)

(57) ABSTRACT

A photosensitive resin composition can achieve both resolution of a fine pattern and conductivity after a heat treatment. The photosensitive resin composition includes: (A) conductive fine particles whose surfaces are coated with an elemental carbon and/or a carbon compound, and (B) an alkali-soluble resin having an acid dissociating group.

17 Claims, No Drawings

PHOTOSENSITIVE RESIN COMPOSITION, METHOD OF MANUFACTURING CONDUCTIVE PATTERN, SUBSTRATE, ELEMENT, AND TOUCH PANEL

TECHNICAL FIELD

This disclosure relates to a photosensitive resin composition, a method of manufacturing a conductive pattern, a substrate, an element and a touch panel.

BACKGROUND

There has recently been a growing need for microminiaturization of electronic wiring following the trend towards higher definition of displays and miniaturization or higher densification of electronic components. A method of manufacturing a conductive pattern used in electronic wiring using a resin composition containing conductive particles is generally a method in which a pattern is formed on a substrate and conductive particles are brought into contact with each other by firing under heating to obtain a conductive pattern. The method of forming a pattern on a substrate includes, for example, a screen printing method, an ink jet method or a photolithographic method and it is considered that the screen printing method and the ink jet method are not suited for formation of a fine pattern and the photolithographic method is suited for formation of a fine pattern.

The photolithographic method is a method in which, after coating and drying a photosensitive composition, the coating film thus obtained is irradiated with ultraviolet rays through a photomask having a fine wiring pattern shape drawn thereon to form the exposed area and the unexposed area on the coating film, and development with a developing solution is performed to form a fine pattern on a substrate, and then a fine conductive pattern is formed by the subsequent electroconductive treatment. The photosensitive composition used in that method is composed of conductive particles, a photosensitizer, a resin and the like (Japanese Unexamined Patent Publication (Kokai) No. 2000-199954).

To form an ultrafine pattern in size of 5 μm or less, there is a need to use, as conductive particles, particles having a smaller particle diameter called metal fine particles. In that case, from the viewpoint of surface smoothness and side face linearity of the pattern, it is necessary to use fine particles having a particle diameter sufficiently smaller than the wiring width required. As a result, mobility of atoms on the surface noticeably increases in fine particle and, when the particles are brought into contact with each other, fusion is likely to occur, thus advantageously serving the purpose of realizing the process at lower temperature.

However, fusion of metal fine particles proceeds even at around room temperature and a composition prepared by using particles having a particle diameter, which is likely to cause fusion, may sometimes cause deterioration of coatability or photosensitivity due to the existence of fused particles having a large size. To prevent that problem, surface coating of various metal fine particles is performed for the purpose of preventing fusion by suppressing contact between metal fine particles.

Coating of metal fine particles with an organic substance in a liquid phase has popularly performed as the method for surface coating and, for example, there have been known silver fine particles whose surfaces are coated with an amine compound (Japanese Unexamined Patent Publication (Kokai) No. 2006-219693 and Japanese Unexamined Patent Publication (Kokai) No. 2008-034358), silver fine particles whose surfaces are coated by a vapor phase reaction method (Japanese Unexamined Patent Publication (Kokai) No. 2013-196997) and the like.

However, if conductive particles are introduced in the amount required to exhibit conductivity after a heat treatment, it is impossible to sufficiently ensure a photosensitizer and a resin required to exhibit photosensitivity, leading to drastic deterioration of patterning property, thus failing to form a fine conductive pattern. Meanwhile, if a photosensitizer and a resin are introduced in the amount required to exhibit photosensitivity, it is impossible to exhibit conductivity after a heat treatment, although satisfactory patterning property is achieved.

It could therefore be helpful to provide a photosensitive resin composition that can achieve both resolution of a fine pattern and conductivity after heat treatment. Use of such photosensitive resin composition enables formation of a high resolution conductive pattern.

SUMMARY

We found that requisite amounts of a photosensitizer and a resin are introduced to thereby exhibit photosensitivity, namely, resolution of a fine pattern and, after a heat treatment, components other than conductive particles are partially or entirely decomposed, whereby the concentration of conductive particles in the total solid component increases to thereby exhibit conductivity.

We thus provide a photosensitive resin composition including: (A) conductive fine particles whose surfaces are coated with an elemental carbon and/or a carbon compound, and (B) an alkali-soluble resin having an acid dissociating group.

The photosensitive resin composition has high sensitivity under exposure even after long-term storage at room temperature, and is also excellent in resolution after pattern formation. By heating in air after exposure and development, acid dissociating groups in a resin are eliminated, thus enhancing volumetric shrinkage of the resin, leading to an increase in the proportion of conductive fine particles. Furthermore, in conductive fine particles with which surfaces are coated, a surface coating layer is allowed to undergo thermo-oxidative decomposition due to oxygen in air, leading to promotion of fusion between conductive fine particles, thus making it possible to obtain a cured film pattern excellent in conductivity.

There is no need to form a conductive cured film pattern by an etching method, thus making it possible to simplify an operation process and avoid deterioration of wiring parts due to a chemical solution during etching, and plasma.

DETAILED DESCRIPTION

The photosensitive resin composition is a composition including: (A) conductive fine particles whose surfaces are coated with an elemental carbon and/or a carbon compound, and (B) an alkali-soluble resin having an acid dissociating group. Photosensitivity in this composition may be either positive photosensitivity or negative photosensitivity, but is preferably negative photosensitivity.

Conductive Fine Particles

The conductive fine particles in (A) conductive fine particles whose surfaces are coated with an elemental carbon and/or a carbon compound include, for example, metal fine particles of gold (Au), silver (Ag), copper (Cu), nickel (Ni), tin (Sn), bismuth (Bi), lead (Pb), zinc (Zn), palladium (Pd), platinum (Pt), aluminum (Al), tungsten (W), or molybdenum (Mo), and the conductive fine particles are preferably metal fine particles containing at least one element selected from the group consisting of gold, silver, copper, nickel, tin, bismuth, lead, zinc, palladium, platinum, aluminum, and carbon, and more preferably metal fine particles of silver.

The method of manufacturing conductive fine particles is preferably a vapor phase reaction method, and more preferably a thermal plasma method with high productivity. The method of generating thermal plasma includes, for example, arc discharge, high frequency plasma, or hybrid plasma, and is preferably high frequency plasma which causes less inclusion of impurities from an electrode.

To make formation of a fine pattern with desired conductivity easy, a particle diameter of the conductive fine particles is preferably 10 to 100 nm, and more preferably 10 to 60 nm. As used herein, the particle diameter of the conductive fine particles refers to a particle diameter converted from a specific surface area (Dp) of the conductive fine particles. The particle diameter converted from a specific surface area (Dp) is the sum total of a surface area of individual particles included in a powder of a unit mass. Assuming that individual particles included in the powder are spherical particles each having the same diameter, the particle diameter converted from a specific surface area Dp is calculated by the following equation.

$$Dp=6/(\rho Sw)$$

where Dp (μm) denotes a particle diameter converted from a specific surface area (particle diameter), $\rho$ denotes a density of spherical particles, and Sw (m$^2$/g) denotes a specific surface area of spherical particles.

The specific surface area Sw (m$^2$/g) (BET value) of the powder can be measured by a fully automatic specific surface area analyzer (for example, MacsorbHM model-1201; manufactured by Mountech Co., Ltd.).

Surface Coating with Elemental Carbon and/or Carbon Compound

Regarding conductive fine particles in (A) conductive fine particles whose surfaces are coated with an elemental carbon and/or a carbon compound, surfaces are coated with an elemental carbon and/or a carbon compound. The existence of a layer, with which surfaces of conductive fine particles made of an elemental carbon and/or a carbon compound are coated (hereinafter "surface coating layer") enables suppression of fusion between conductive fine particles.

The method for such surface treatment includes, for example, a method in which, when producing conductive fine particles by a thermal plasma method, conductive fine particles are brought into contact with a reactive gas (Japanese Unexamined Patent Publication (Kokai) No. 2007-138287). It is preferred that each surface of conductive fine particles is completely coated. However, coating is performed for the purpose of preventing fusion between conductive fine particles at low temperature, and it is permitted that incompletely coated particles partially exist.

An average thickness of the surface coating layer is preferably 0.1 to 10 nm since fine pattern processability is improved by suppressing fusion between conductive fine particles and desired conductivity is exhibited by heat-treating at a temperature of 300° C. or lower.

The average thickness of the surface coating layer can be determined such that: a mass loss of conductive fine particles whose surfaces are coated with an elemental carbon and/or a carbon compound by a thermobalance is measured and, assuming that the value is entirely based on the combustion of carbon, the average thickness of the surface coating layer can be calculated from the particle diameter by regarding the density of carbon as 2.0. Conductive fine particles each having a known particle diameter (Dp) shall be coated with carbon in an average thickness of A (μm). The number of particles coated with carbon is n. When the mass weighed first by measuring using the thermobalance is W$_1$ (g), the mass weighed after completely scattering carbon is W$_2$ (g), and the density of conductive fine particles is $\rho$, if Dp and W$_2$ are found, it is possible to calculate "n" from the following equation.

$$W_2=\pi/6 \times Dp^3 \rho \times n$$

The average thickness A of the surface coating layer can be calculated by the following equation.

$$W_1-W_2=\{4/3 \times \pi (Dp/2+A)^3 - \pi/6 \times Dp^3\} \times 2.0 \times n$$

The content of (A) conductive fine particles whose surfaces are coated with an elemental carbon and/or a carbon compound in a photosensitive resin composition is preferably 70 to 95% by mass, more preferably 75 to 95% by mass, and still more preferably 75 to 90% by mass, relative to the total solid component in the composition to obtain desired conductivity and pattern processability having higher resolution without disturbing contact between conductive fine particles by the residual organic component. By including conductive fine particles in the above range, not only is the thus obtained composition also excellent in long-term storage at room temperature and can exhibit pattern processability, but also a heat treatment in air at 100 to 300° C. enables an elemental carbon and/or a carbon compound composing a surface coating layer to be partially or entirely decomposed by oxygen in air, leading to increase in concentration of a conductive substance in the total solid component, thus making it possible to exhibit conductivity. As used herein, the total solid component refers to all components except for a solvent among components included in the photosensitive resin composition.

Alkali-Soluble Resin having Acid Dissociating Group (B) The alkali-soluble resin having an acid dissociating group is generally obtained by copolymerizing a compound having a carboxyl group with a compound having an acid dissociating group. More specific examples thereof include a copolymer of a (meth)acrylic acid compound having a carboxyl group with a (meth)acrylic ester having an acid dissociating group. In this case, an acrylic resin having an acid dissociating group is obtained. This acrylic resin is alkali-soluble because of having a carboxyl group in the side chain.

(B) The alkali-soluble resin having an acid dissociating group is preferably an alkali-soluble resin obtained by radical polymerization of a monomer such as a vinyl aromatic compound, an amide-based unsaturated compound, or the other vinyl-based compound, in addition to a (meth)acrylic acid compound having a carboxyl group or a (meth)acrylic ester having an acid dissociating group. A catalyst for radical polymerization is generally an azo compound such as azobisisobutyronitrile or an organic peroxide such as benzoyl peroxide.

The conditions of radical polymerization can be appropriately determined. For example, it is preferred that (meth)acrylic acid, (meth)acrylic ester, and a radical polymerization catalyst are added in a solvent and a reaction vessel is purged thoroughly with nitrogen by bubbling or vacuum degassing, and then the reaction is performed at 60 to 110° C. for 30 to 300 minutes. If necessary, a chain transfer agent such as a thiol compound may be used.

The (meth)acrylic acid compound having a carboxyl group includes, for example, (meth)acrylic acid, itaconic acid, maleic acid, 2-(meth)acryloyloxyethylsuccinic acid, 2-(meth)acryloyloxyethylhexahydrophthalic acid or 2-(meth)acryloyloxyethylphthalic acid.

The (meth)acrylic ester includes, for example, methyl (meth)acrylate, ethyl (meth)acrylate, propyl (meth)acrylate, cyclopropyl (meth)acrylate, cyclopentyl (meth)acrylate, cyclohexyl (meth)acrylate, cyclohexenyl (meth)acrylate, 4-methoxycyclohexyl (meth)acrylate, 2-cyclopropyloxycarbonylethyl (meth)acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, 2-(4-methoxycyclohexyl)oxycarbonylethyl (meth)acrylate, norbornyl (meth)acrylate, isobornyl (meth)acrylate, tricyclodecanyl (meth)acrylate, tetracyclodecanyl (meth)acrylate, dicyclopentenyl (meth)acrylate, adamantyl (meth)acrylate, adamantylmethyl (meth)acrylate, 1-methyladamantyl (meth)acrylate, tert-butyl (meth)acrylate, tert-butoxycarbonyl (meth)acrylate, benzyl (meth)acrylate or tetrahydropyranyl (meth)acrylate.

The vinyl aromatic compound includes, for example, an aromatic vinyl compound such as styrene, p-methylstyrene, o-methylstyrene, m-methylstyrene or α-methylstyrene.

The amide-based unsaturated compound includes, for example, (meth)acrylamide, N-methylolacrylamide or N-vinylpyrrolidone.

The other vinyl-based compound includes, for example, (meth)acrylonitrile, allyl alcohol, vinyl acetate, cyclohexyl vinyl ether, n-propylvinyl ether, i-propyl vinyl ether, n-butyl vinyl ether, i-butyl vinyl ether, 2-hydroxyvinyl ether or 4-hydroxyvinyl ether.

To perform decomposition or evaporation after elimination of an acid dissociating group, the acid dissociating group is preferably an organic group having 4 to 15 carbon atoms, and more preferably an organic group having 6 to 15 carbon atoms. When the acid dissociating group has less than 4 carbon atoms, since evaporation occurs at low temperature after elimination, large bubbles may be generated in the film to thereby disturb contact between conductive fine particles, thus causing deterioration of conductivity. Whereas, in the acid dissociating group having carbon atoms of more than 15, dissociable groups may remain in the film after elimination to thereby disturb contact between conductive fine particles, thus causing deterioration of conductivity. When the acid dissociating group is an organic group having 6 to 15 carbon atoms, it is easy to remove bubbles by post baking if bubbles are generated in the film, thus enabling formation of a conductive pattern having satisfactory conductivity.

The acid dissociating group includes, for example, a tert-butyl group, a tert-butoxycarbonyl group, a benzyl group, a methyladamantyl group, or a tetrahydropyranyl group.

The (meth)acrylic ester having an acid dissociating group includes, for example, 1-methyladamantyl (meth)acrylate, tert-butyl (meth)acrylate, tert-butoxycarbonyl (meth)acrylate, benzyl (meth)acrylate or tetrahydropyranyl (meth)acrylate.

In the photosensitive resin composition, the content of (B) the acid dissociating group-containing alkali-soluble resin is preferably 10 to 30% by mass relative to the total solid component, taking exhibition of photosensitivity into consideration.

(B) The alkali-soluble resin having an acid dissociating group is preferably an alkali-soluble resin obtained by radical polymerization of 20 to 80 mol % of a compound having an acid dissociating group. It is particularly preferred to contain, as a monomer component, 20 to 80 mol % of a (meth)acrylic ester having an acid dissociating group in an alkali-soluble resin. By using (B) the alkali-soluble resin having an acid dissociating group, the acid dissociating group is easily allowed to undergo thermo-oxidative decomposition and elimination in air at 100 to 300° C., leading to significant shrinkage of the film, thus making it possible to easily increase the concentration of conductive fine particles (A) in the total solid component. As a result, it becomes easy to obtain desired conductivity with resistivity of 10 to 1,000 μΩ·cm. In this case, more remarkable effect is exerted when using the below-mentioned photo-acid-generating agent and/or thermal-acid-generating agent in combination, thus making it possible to obtain a finer pattern.

From the viewpoint of high resolution and an improvement in developing margin, (B) the alkali-soluble resin having an acid dissociating group preferably has a radical polymerizable group. If (B) the alkali-soluble resin having an acid dissociating group has no radical polymerizable group, developing margin may become insufficient, thus failing to obtain a high resolution pattern.

To introduce a radical polymerizable group, it is preferred to react a resin having a carboxyl group with a monosubstituted epoxy compound having a radical polymerizable group. In this case, it is preferred to partially react carboxyl groups in the resin having a carboxyl group with epoxy groups in the monosubstituted epoxy compound having a radical polymerizable group. The resin having a carboxyl group is preferably an acrylic resin having a carboxyl group. Inclusion of a radical polymerizable group enables photo-radical polymerization. The radical polymerizable group is preferably a (meth)acryloyl group having high photoradical polymerization reactivity.

The catalyst used in the addition reaction of the monosubstituted epoxy compound having a radical polymerizable group includes, for example, an amino-based catalyst such as dimethylaniline, 2,4,6-tris(dimethylaminomethyl)phenol, or dimethylbenzylamine; a tin-based catalyst such as tin(II) 2-ethylhexanoate or dibutyltin laurate; a titanium-based catalyst such as titanium(IV) 2-ethylhexanoate; a phosphorus-based catalyst such as triphenylphosphine; or a chromium-based catalyst such as acetylacetone chromium or chromium chloride.

The monosubstituted epoxy compound having a radical polymerizable group includes, for example, glycidyl (meth)acrylate, 2-(glycidyloxy)ethyl (meth)acrylate, 3-(glycidyloxy)propyl (meth)acrylate, 4-(glycidyloxy)butyl (meth)acrylate, 4,5-epoxypentyl (meth)acrylate, 5,6-epoxyhexyl (meth)acrylate, 6,7-epoxyheptyl (meth)acrylate, allyl glycidyl ether, vinyl glycidyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-diglycidyloxymethylstyrene, 2,4-diglycidyloxymethylstyrene, 2,5-diglycidyloxymethylstyrene, 2,6-diglycidyloxymethylstyrene, 2,3,4-triglycidyloxymethyl styrene, 2,3,5-triglycidyloxymethyl styrene, 2,3,6-triglycidyloxymethylstyrene, 3,4,5-triglycidyloxymethyl styrene or 2,4,6-triglycidyloxymethylstyrene. Glycidyl (meth)acrylate, 2-(glycidyloxy)ethyl (meth)acrylate, 3-(glycidyloxy)propyl (meth)acrylate or 4-(glycidyloxy)butyl (meth)acrylate is preferable since it is easy to control the reaction of the epoxy group and the radical polymerizable group has high reactivity.

A carboxylic acid equivalent of an acrylic resin obtained by reacting an acrylic resin having a carboxyl group and an acid dissociating group with a monosubstituted epoxy compound having a radical polymerizable group is preferably 200 to 1,400 g/mol, and more preferably 400 to 1,000 g/mol. The carboxylic acid equivalent of the acrylic resin can be calculated by measuring an acid value.

A double bond equivalent of an acrylic resin obtained by reacting an acrylic resin having a carboxyl group and an acid dissociating group with a monosubstituted epoxy compound having a radical polymerizable group is preferably 150 to 10,000 g/mol since it is possible to achieve both hardness and crack resistance at a high level. The double bond equivalent of the acrylic resin can be calculated by measuring an iodine value.

A weight average molecular weight (Mw) of an acrylic resin obtained by reacting an acrylic resin having a carboxyl group and an acid dissociating group with a monosubstituted epoxy compound having a radical polymerizable group, as measured by gel permeation chromatography (GPC) in terms of polystyrene, is preferably 1,000 to 100,000. By adjusting the weight average molecular weight (Mw) in the above range, satisfactory coating properties are obtained, and also satisfactory solubility in a developing solution is obtained in the case of forming a pattern.

Dispersing Agent

The photosensitive resin composition may include: (C) a dispersing agent. Inclusion of (C) the dispersing agent enables (A) conductive fine particles whose surfaces are coated with an elemental carbon and/or a carbon compound to stably exist in the photosensitive resin composition.

(C) The dispersing agent is preferably an amine-based dispersing agent. The commercially available amine-based (C) dispersing agent includes, for example, DISPERBYK106, 108, 112, 116, 142, 145, 166, 180, 2001, 2008, 2022, 2150, 6919 or 21116 (all manufactured by BYK Japan KK), or Efka4300, 4400, 4401, 4403, 4406, 4510, 4570, 4800, 5054, 5055 or 5207 (all manufactured by BASF).

To further improve dispersibility, (C) the dispersing agent preferably has an acrylic block copolymer structure. A commercially available amine-based (C) dispersing agent having an acrylic block copolymer structure includes, for example, DISPERBYK2001, 2008, 2022, 2150, 6919 or 21116 or Efka4300.

The content of (C) the dispersing agent in the photosensitive resin composition is preferably 1 to 7 parts by mass relative to 100 parts by mass of the total amounts of (A) conductive fine particles and the below-mentioned other particles to achieve satisfactory dispersion of conductive fine particles, finer pattern formation, progressed contact and fusion between conductive fine particles, and higher conductivity.

Photopolymerization Initiator

The photosensitive resin composition may include: (D) a photopolymerization initiator. Inclusion of the photopolymerization initiator (D) enables the photosensitive resin composition to be imparted with negative photosensitivity.

(D) The photopolymerization initiator includes, for example, acetophenone-based compounds, benzophenone-based compounds, benzoin ether-based compounds, α-aminoalkylphenone-based compounds, thioxanthone-based compounds, organic peroxide, imidazole-based compounds, titanocene-based compounds, triazine-based compounds, acylphosphineoxide compounds, quinone compounds or oxime ester-based compounds. Oxime ester-based compounds having high sensitivity are preferable since high sensitivity is achieved even if compounds are added in a small amount, and oxime ester-based compounds including a carbazole skeleton are more preferable. Oxime ester-based compounds including no carbazole skeleton include, for example, Irgacure OXE 01 (manufactured by BASF Ltd.), and oxime ester-based compounds including a carbazole skeleton include, for example, Irgacure OXE02 (manufactured by BASF Ltd.), ADEKA OPTOMER N1919 (manufactured by ADEKA CORPORATION) or ADEKA ARKLS NCI-831 (manufactured by ADEKA CORPORATION).

Solvent

The photosensitive resin composition may include: (E) a solvent.

(E) The solvent includes, for example, propylene glycol monomethyl ether, propylene glycol monobutyl ether, 2-heptanol, cyclohexanol, cyclopentanol, 2-butanol, 2-pentanol, t-butanol, diacetone alcohol, α-terpineol, methyl 2-hydroxyisobutyrate, ethyl 2-hydroxyisobutyrate, propylene glycol monoethyl ether acetate, ethyl acetoacetate, methyl acetoacetate, methyl-3-methoxypropionate, 3-methyl-3-methoxybutyl acetate, cyclopentanone, cyclohexanone, benzyl ethyl ether, dihexyl ether, acetonylacetone, isophorone, benzyl acetate, ethyl benzoate, diethyl oxalate, diethyl maleate, ethylene carbonate, propylene carbonate, methyl benzoate, ethyl benzoate, diethyl maronate, β-propiolactone, γ-butyrolactone, γ-valerolactone, δ-valerolactone, γ-caprolactone, ε-caprolactone, ethylene glycol monobutyl ether acetate, diethylene glycol monoethyl ether acetate, diethylene glycol monobutyl ether acetate, diethylene glycol dimethyl ether, diethylene glycol diethyl ether, diethylene glycol methylethyl ether, dipropylene glycol methyl ether acetate, dipropylene glycol dimethyl ether, propylene glycol diacetate, 1,3-butylene glycol diacetate, cyclohexanol acetate, dimethyl sulfoxide, methyl ethyl ketone, isobutyl acetate, isobutyl acetate, butyl acetate, propyl acetate, isopropyl acetate, acetylacetone, triacetin or 2-heptanone.

Other Particles

The photosensitive resin composition may contain other particles except for conductive fine particles whose surfaces are coated with an elemental carbon and/or a carbon compound (A) to improve dispersibility and control conductivity. Other particles include, for example, metal fine particles whose surfaces are not coated, or metal oxide fine particles, organic pigments or inorganic pigments.

The particle diameter of these other particles is preferably 10 to 100 nm. The particle diameter of less than 10 nm may lead to an increase in frequency of use for stabilization of dispersion, thus making it difficult to obtain desired conductivity. Meanwhile, the particle diameter of more than 100 nm may lead to deterioration of resolution of a pattern, thus making it difficult to form an ultrafine pattern in size of 5 μm or less.

It is possible to use these other particles in combination with (C) the dispersing agent, and carbon black contributing to control of conductivity is preferable.

Carbon black includes, for example, MA77, 7, 8, 11, 100, 100R, 100S, 230, 220 or 14 (all manufactured by Mitsubishi Chemical Corporation), #52, 47, 45, 45L, 44, 40, 33, 32, 30, 25, 20, 10, 5, 95, 85 or 260 (all manufactured by Mitsubishi Chemical Corporation), Special Black100, 250, 350 or 550 (all manufactured by Evonik Degussa Co., Ltd.), or Printex95, 90, 55, 45, 40, P, 60, L6, L, 300, 30, ES23, 9, E522, 35, 25, 200, A or G (all manufactured by Evonik Degussa Co., Ltd.). MA77, 7, 8, 11, 100, 100R, 100S, 230, 220 or 14 or Special Black100, 250, 350 or 550, which has the pH value of 4 or less, is preferable. The pH value of carbon black can be measured in accordance with JIS K5101.

Photo-Acid-Generating Agent, and Thermal-Acid-Generating Agent

The photosensitive resin composition may include: (F) a photo-acid-generating agent and/or a thermal-acid-generating agent. An acid thus generated promotes decomposition of acid dissociating groups in (B) the alkali-soluble resin having an acid dissociating group, thus enabling falling of the heat treatment temperature in air.

The thermal-acid-generating agent, which is a compound capable of generating an acid under heating, includes, for example, SI-60, SI-80, SI-100, SI-110, SI-145, SI-150, SI-60L, SI-80L, SI-100L, SI-110L, SI-145L, SI-150L, SI-160L, SI-180L or SI-200 (all manufactured by SANSIN CHEMICAL INDUSTRY CO, LTD.), 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, and 2-methylbenzyl-4-benzoyloxyphenylmethylsulfonium or methansulfonates, trifluoromethansulfonates, camphorsulfonates or p-toluenesulfonates thereof, and is preferably 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium or 2-methylbenzyl-4-benzoyloxyphenylmethylsulfonium or methansulfonate, trifluoromethansulfonate, camphorsulfonate or p-toluenesulfonate thereof.

The content of the thermal-acid-generating agent in the photosensitive resin composition is preferably 0.01 to 3 parts by mass relative to 100 parts by mass of (B) the alkali-soluble resin having an acid dissociating group to promote decomposition of acid dissociating groups in (B) the alkali-soluble resin having an acid dissociating group, and to obtain higher resolution without disturbing contact between conductive fine particles.

An acid generated from the photo-acid-generating agent, which is a compound capable of generating an acid under light, is preferably a strong acid such as perfluoroalkylsulfonic acid or p-toluenesulfonic acid to promote decomposition of acid dissociating groups in (B) the alkali-soluble resin having an acid dissociating group.

The photo-acid-generating agent includes, for example, SI-101, SI-105, SI-106, SI-109, PI-105, PI-106, PI-109, NAI-100, NAI-1002, NAI-1003, NAI-1004, NAI-101, NAI-105, NAI-106, NAI-109, NDI-101, NDI-105, NDI-106, NDI-109, PAI-01, PAI-101, PAI-106 or PAI-1001 (all manufactured by Midori Kagaku Co., Ltd.), SP-077 or SP-082 (all manufactured by ADEKA CORPORATION), TPS-PFBS (manufactured by Toyo Gosei Co., Ltd.), CGI-MDT or CGI-NIT (all manufactured by Ciba Japan K.K.) or WPAG-281, WPAG-336, WPAG-339, WPAG-342, WPAG-344, WPAG-350, WPAG-370, WPAG-372, WPAG-449, WPAG-469, WPAG-505 or WPAG-506 (all manufactured by Wako Pure Chemical Industries, Ltd.).

The content of the photo-acid-generating agent in the photosensitive resin composition is preferably 0.01 to 5 parts by mass (B) relative to 100 parts by mass of the alkali-soluble resin having an acid dissociating group to promote decomposition of acid dissociating groups in (B) the alkali-soluble resin having an acid dissociating group, and obtain higher resolution without disturbing contact between conductive fine particles.

To further promote decomposition of acid dissociating groups, the thermal-acid-generating agent and the photo-acid-generating agent may be used in combination.

Sensitizer

When the photosensitive resin composition includes: (F) a photo-acid-generating agent, the photosensitive resin composition may further include a sensitizer. The sensitizer is preferably a sensitizer that evaporates by a heat treatment or a sensitizer that causes fading due to irradiation with light even when remaining on a cured film, and more preferably a sensitizer that causes fading due to irradiation with light from the viewpoint of high resolution in pattern formation.

The sensitizer that evaporates by a heat treatment or causes fading due to irradiation with light, includes, for example, coumarin such as 3,3'-carbonylbis(diethylaminocoumarin); anthraquinone such as 9,10-anthraquinone; aromatic ketone such as benzophenone, 4,4'-dimethoxybenzophenone, acetophenone, 4-methoxyacetophenone or benzaldehyde; or fused aromatic such as biphenyl, 1,4-dimethylnaphthalene, 9-fluorenone, fluorene, phenanthrene, triphenylene, pyrene, anthracene, 9-phenylanthracene, 9-methoxyanthracene, 9,10-diphenylanthracene, 9,10-bis(4-methoxyphenyl)anthracene, 9,10-bis(triphenylsilyl)anthracene, 9,10-dimethoxyanthracene, 9,10-diethoxyanthracene, 9,10-dipropoxyanthracene (DPA; manufactured by Kawasaki Kasei Chemicals.), 9,10-dibutoxyanthracene (DBA; manufactured by Kawasaki Kasei Chemicals.), 9,10-dipentaoxyanthracene, 2-t-butyl-9,10-dibutoxyanthracene or 9,10-bis(trimethylsilylethynyl)anthracene.

The sensitizer that evaporates by a heat treatment is preferably a sensitizer that undergoes sublimation or evaporation by a heat treatment or a sensitizer in which a thermal decomposition product by thermal decomposition undergoes sublimation or evaporation. The evaporation temperature of the sensitizer is preferably 150 to 300° C. to cause no evaporation at a pre-baked temperature, and allow it to undergo decomposition and evaporation during thermal curing to cause contact and fusion between conductive fine particles.

The sensitizer is preferably an anthracene-based compound since it can achieve high sensitivity and high resolution, and is also dimerized by irradiation with light, leading to fading, more preferably a 9,10-disubstituted anthracene-based compound which is thermally stable, and still more preferably a 9,10-dialkoxyanthracene-based compound represented by general formula (1) from the viewpoint of an improvement in solubility of the sensitizer and reactivity of the photodimerization reaction.

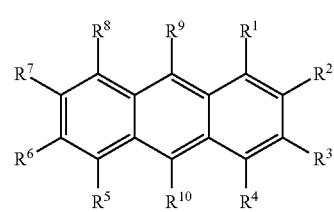

(1)

wherein $R^1$ to $R^8$ each independently represents hydrogen, an alkyl group, alkoxy group, alkenyl group, ethynyl group, aryl group, or acyl group, each having 1 to 20 carbon atoms or an organic group substituted with them, and $R^9$ and $R^{10}$ each independently represents an alkoxy group having 1 to 20 carbon atoms or an alkoxy group substituted with other organic groups.

The alkyl group in $R^1$ to $R^8$ includes, for example, a methyl group, an ethyl group or an n-propyl group. The alkoxy group includes, for example, a methoxy group, an ethoxy group, a propoxy group, a butoxy group or a pentyloxy group. The alkenyl group includes, for example, a vinyl group, an acryloxypropyl group or a methacryloxypropyl group. The aryl group includes, for example, a phenyl group, a tolyl group or a naphthyl group. The acyl group includes, for example, an acetyl group. From the viewpoint of vaporizability of the compound and reactivity of photodimerization, $R^1$ to $R^8$ are preferably hydrogens or organic groups having 1 to 6 carbon atoms, and $R^1$, $R^4$, $R^5$, and $R^8$ are more preferably hydrogens.

The substituent, with which the alkoxy group is substituted in $R^9$ and $R^{10}$, includes, for example, an alkoxy group or an acyl group. In this case, the alkoxy group includes, for example, a methoxy group, an ethoxy group, a propoxy group, a butoxy group, a pentyloxy group, a methoxyethoxy group, a 1-methoxy-2-propoxy group or a 1-acetyl-2-propoxy group, and is preferably a propoxy group or a butoxy group from the viewpoint of solubility of the compound and the color fading reaction by photodimerization.

The content of the sensitizer in the photosensitive resin composition is preferably 0.001 to 5 parts by mass, and more preferably 0.005 to 1 part by mass, relative to 100 parts by mass of (B) the alkali-soluble resin having an acid dissociating group to exert sufficient sensitizing effect of exposing a photo-acid-generating agent to light, and obtain higher resolution without disturbing contact between conductive fine particles.

Pigment and/or Dye having Absorption in Visual Light Range

The photosensitive resin composition may include (X) a pigment and/or a dye having an absorption in visual light range as long as contact and fusion between conductive fine particles are not disturbed. Inclusion of (X) a pigment and/or a dye having an absorption in visual light range in the photosensitive resin composition enables suppression of reflection of visible light of a conductive pattern after post baking.

The pigment having an adsorption in visual light range includes, for example, a lactam-based pigment, a perylene-based pigment, a phthalocyanine-based pigment, an isoisoindolin-based pigment, a diaminoanthraquinone-based pigment, a dioxazine-based pigment, an indanthrone-based pigment, carbon black or an inorganic pigment.

The blue pigment includes, for example, C.I. Pigment Blue (hereinafter "PB") 15, PB15:1, PB15:2, PB15:3, PB15:4, PB15:5, PB15:6, PB16 or PB60. The violet pigment includes, for example, C.I. Pigment Violet (hereinafter "PV") 19, PV23 or PV37. The red pigment includes, for example, C.I. Pigment Red (hereinafter "PR") 149, PR166, PR177, PR179, PR209 or PR254. The green pigment includes, for example, C.I. Pigment Green (hereinafter "PG") 7, PG36 or PG58. The yellow pigment includes, for example, C.I. Pigment Yellow (hereinafter "PY") 150, PY138, PY139 or PY185. The black pigment includes, for example, furnace black such as HCF, MCF, LFF, RCF, SAF, ISAF, HAF, XCF, FEF, GPF or SRF; thermal black such as FT or MT; carbon black such as channel black or acetylene black, or lactam-based pigment (for example, "IRGAPHOR" (registered trademark) Black S0100CF; manufactured by BASF). Of these, carbon black excellent in heat resistance, light resistance, and absorption property of visible light is preferable from the viewpoint of conductivity and dispersibility, and furnace black or a lactam-based pigment is more preferable.

Carbon black includes, for example, MA77, 7, 8, 11, 100, 100R, 100S, 230, 220 or 14 (all manufactured by Mitsubishi Chemical Corporation), #52, 47, 45, 45L, 44, 40, 33, 32, 30, 25, 20, 10, 5, 95, 85 or 260 (all manufactured by Mitsubishi Chemical Corporation), Special Black100, 250, 350 or 550 (all manufactured by Evonik Degussa Co., Ltd.) or Printex95, 90, 55, 45, 40, P, 60, L6, L, 300, 30, ES23, 9, ES22, 35, 25, 200, A and G. Carbon black is preferably MA77, 7, 8, 11, 100, 100R, 100S, 230, 220 or 14, or Special Black100, 250, 350 or 550, each having the pH value of 4 or less. The pH value of carbon black can be measured in accordance with JIS K5101.

The amount of the pigment having an absorption in visible light range to be added in the photosensitive resin composition is preferably 2 to 30 parts by mass relative to 100 parts by mass of (B) the alkali-soluble resin having an acid dissociating group.

The dye having an absorption in visible light range includes, for example, a ferrocene-based dye, a fluorenone-based dye, a perylene-based dye, a triphenylmethane-based dye, a coumarin-based dye, a diphenylamine-based dye, a quinacridone-based dye, a quinophthalone-based dye, a phthalocyanine-based dye or a xanthene-based dye. A black dye excellent in heat resistance, light resistance, and absorption property of visible light is preferable, and VALIFAST Black 1888, VALIFAST Black 3830, NUBIAN Black PA-2802 or OIL Black 860 is preferable.

The amount of the dye having an absorption in visible light range to be added in the photosensitive resin composition is preferably 2 to 40 parts by mass relative to 100 parts by mass of (B) the alkali-soluble resin having an acid dissociating group.

Other Components

The photosensitive resin composition may include an acrylic monomer or the other acrylic polymer having no acid dissociating group from the viewpoint of adjusting photosensitivity and improving pattern processability, as long as contact and fusion between conductive fine particles are not disturbed.

The acrylic monomer includes, for example, trimethylolpropane tri(meth)acrylate, pentaerythritol tri(meth)acrylate, pentaerythritol penta(meth)acrylate, pentaerythritol tetra(meth)acrylate, dipentaerythritol hexa(meth)acrylate, or dipentaerythritol penta(meth)acrylate, or an alkyl-modified, alkyl ether-modified or alkyl ester-modified monomer thereof.

The other acrylic polymer having no acid dissociating group includes, for example, SIRIUS-501 (manufactured by OSAKA ORGANIC CHEMICAL INDUSTRY LTD.) which is a polyfunctional acrylate including a dendrimer structure.

If necessary, the photosensitive resin composition may further include an adhesion improver, a surfactant or a polymerization inhibitor.

The adhesion improver includes, for example, a silane coupling agent such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane or 3-mercaptopropyltrimethoxysilane.

The surfactant includes, for example, an anionic surfactant such as ammonium lauryl sulfate or polyoxyethylene alkyl ether sulfate triethanolamine; a cationic surfactant such as stearylamine acetate or lauryltrimethylammonium chloride; an amphoteric surfactant such as lauryldimethylamine oxide or lauryl carboxymethylhydroxyethyl imidazolium betaine; a nonionic surfactant such as polyoxyethylene lauryl ether, polyoxyethylene stearyl ether or sorbitan monostearate; and a fluorine-based surfactant or a silicon-based surfactant.

The amount of the surfactant to be added in the photosensitive resin composition is preferably 0.001 to 10% by mass, and more preferably 0.01 to 1% by mass, relative to the total composition to obtain satisfactory coatability, and uniformity of a surface of a coating film surface. The addition amount of less than 0.001% by mass may lead to insufficient coatability and effect of uniformity of a surface of a coating film. The addition amount of more than 10% by mass may lead to the occurrence of coating film defects such as repellence and concavity, and agglomeration of particles.

The polymerization inhibitor includes, for example, hydroquinone-based, catechol-based, phosphorus-based, sulfur-based, amine-based or hindered phenol-based compound. Of these, a hydroquinone-based or catechol-based compound, which does not inhibit solubility in solvent and dispersion stability of a pigment, is preferable, and hydroquinone, tert-butylhydroquinone, 2,5-bis (1,1,3,3-tetramethylbutyl) hydroquinone, 2,5-bis(1,1-dimethylbutyl)hydroquinone, catechol or tert-butyl catechol is more preferable.

Method of Manufacturing Photosensitive Resin Composition

The photosensitive resin composition may be manufactured by directly dispersing conductive fine particles in a resin solution using a dispersing device. However, since it is difficult to uniformly disperse conductive fine particles, it is preferred to manufacture by using a method in which conductive fine particles are dispersed in advance in an organic solvent using a dispersing agent, and then this dispersing liquid is mixed with a solution containing a monomer, a polymer, an adhesion improver, a surfactant, and a polymerization inhibitor. To prevent a surface coating layer from being damaged, the dispersing liquid of silver fine particles whose surfaces are coated is preferably dispersed using a mild dispersing device or a media-less dispersing device, and more preferably a media-less dispersing device. The dispersing liquid of silver fine particles whose surfaces are coated can be prepared, for example, by dispersing silver fine particles in an organic solvent using a dispersing device such as a mild dispersing machine NANO GETTER or a media-less, high-pressure and wet-type pulverization machine NANOMIZER. The dispersion method, using a ball mill, a sand grinder, a triple roll mill or a high-speed impact mill, may damage a surface coating layer of silver fine particles, thus promoting fusion between silver fine particles.

Method of Manufacturing Conductive Pattern

Next, a description will be made of a method of manufacturing a conductive pattern by a photolithographic method using the photosensitive resin composition.

The method of manufacturing a conductive pattern is performed by a process including a coating step of coating a photosensitive resin composition on a surface of a substrate surface; a pre-baking step of drying the coated substrate; a step of subjecting the coated substrate to exposure and development to form a pattern (exposure step, developing step); and a post baking step of post-baking the pattern.

The substrate used in the coating step includes, for example, a silicon wafer, a ceramic substrate or an organic substrate. The ceramic substrate includes, for example, a glass substrate such as soda glass, non-alkali glass, borosilicate glass or quartz glass; an alumina substrate, an aluminum nitride substrate or a silicon carbide substrate. The organic substrate includes, for example, an epoxy substrate, a polyetherimide resin substrate, a polyetherketone resin substrate, a polysulfone-based resin substrate, a polyimide film or a polyester film.

The method of coating the photosensitive resin composition on a surface of a substrate includes, for example, coating using a spin coater, a bar coater, a blend coater, a roll coater, a die coater, a calender coater or a meniscus coater, screen coating, spray coating or dip coating.

The dry method in the pre-baking step includes, for example, a method of drying using a hot plate, a hot air dryer (oven), drying under reduced pressure, vacuum drying or drying by infrared irradiation.

The pre-baking temperature and time may be appropriately determined according to the composition of the photosensitive resin composition, and the film thickness of a coating film to be dried, and heating is preferably performed at a temperature of 50 to 150° C. for 10 seconds to 30 minutes.

It is preferred to use heating by a hot plate or a hot air dryer (oven) in combination with drying under reduced pressure since a solvent can be removed by drying while suppressing thermal curing of a resin contained in the coating film. Ultimate pressure of drying under reduced pressure is preferably 10 to 200 Pa, and more preferably 30 to 100 Pa.

A light source used in the exposure step is preferably j-line, i-line, h-line or g-line of a mercury lamp.

The alkali substance used in an alkali developing solution in the developing step includes organic alkalis, for example, inorganic alkalis such as sodium hydroxide, potassium hydroxide, sodium carbonate, potassium carbonate, sodium silicate, sodium metasilicate or ammonia water; primary amines such as ethylamine or n-propylamine; secondary amines such as diethylamine or di-n-propylamine; tertiary amines such as triethylamine or methyldiethylamine; tetraalkylammonium hydroxides such as tetramethylammonium hydroxide (TMAH); quaternary ammonium salts such as choline; alcohol amines such as triethanolamine, diethanolamine, monoethanolamine, dimethylaminoethanol or dimethylaminoethanol; or cyclic amines such as pyrrole, piperidine, 1,8-diazabicyclo[5,4,0]-7-undecene, 1,5-diazabicyclo[4,3,0]-5-nonane or morpholine. To these organic alkalis, a water-soluble organic solvent such as ethanol, γ-butyrolactone, dimethylformamide or N-methyl-2-pyrrolidone may be appropriately added.

To obtain a more satisfactory conductive pattern, it is also preferred to further add 0.01 to 1% by mass of a surfactant such as a nonionic surfactant to these alkali developing solutions.

The drying method in the post baking step includes the same drying method as in the pre-baking step. The atmosphere, temperature, and time of post baking may be appropriately determined according to the composition of the photosensitive resin composition, and the film thickness of a coating film to be dried, and heating is preferably performed in air at a temperature of 100 to 300° C. for 5 to 120 minutes.

If the conductive pattern is formed on a substrate in a mesh-like shape, it is possible to use as a transparent conductive wiring included in a display panel such as a touch panel, a liquid crystal or organic EL or an element such as a wearable terminal.

Since the conductive pattern is not transparent, wiring is visually recognized by users if the pattern has a large width. Therefore, the width of the conductive pattern is preferably 5 μm or less.

EXAMPLES

Examples will be described below. First, materials used in Examples and Comparative Examples will be described.

(A) Conductive Fine Particles whose Surfaces are coated with Elemental Carbon and/or Carbon Compound (A-1) Silver fine particles in which a surface carbon coating layer has an average thickness of 1 nm and a particle diameter of 40 nm (manufactured by Nisshin Engineering Inc.)

(A-2) Silver fine particles in which a surface carbon coating layer has an average thickness of 3 nm and a particle diameter of 60 nm (manufactured by Nisshin Engineering Inc.)

(A-3) Silver fine particles in which a surface carbon coating layer has an average thickness of 10 nm and a particle diameter of 100 nm (manufactured by Nisshin Engineering Inc.)

(A-4) Silver fine particles in which a surface carbon coating layer has an average thickness of 0.5 nm and a particle diameter of 50 nm (manufactured by Nisshin Engineering Inc.)

(A-5) Silver fine particles in which a surface carbon coating layer has an average thickness of 0.2 nm and a particle diameter of 40 nm (manufactured by Nisshin Engineering Inc.)

(A-6) Silver fine particles NB-01 (Lot. 2011-10; manufactured by NaBond)

(A-7) Silver fine particles in which a surface carbon coating layer has an average thickness of 30 nm and a particle diameter of 80 nm (manufactured by Nisshin Engineering Inc.)

(C) Dispersing Agent (C-1) DISPERBYK140 (manufactured by BYK Japan KK) (amine value: 146 mgKOH/g)

(C-2) DISPERBYK21116 (manufactured by BYK Japan KK) (amine value: 73 mgKOH/g).

(E) Solvent (E-1) PGMEA: propylene glycol monomethyl ether acetate (E-2) DAA: diacetone alcohol Preparation of Conductive Fine Particle Dispersion Preparation of Silver Fine Particle Dispersion (A-1-1)

Using a homogenizer, 80.00 g of silver fine particles (A-1), 4.06 g of a dispersing agent (C-1), and 196.14 g of a solvent (E-1) were subjected to a mixing treatment at 1,200 rpm for 30 minutes, and the mixed solution was dispersed using a mill type dispersion machine filled with zirconia beads to obtain a silver particle dispersion (A-1-1).

Preparation of Silver Fine Particle Dispersion (A-1-2)

Using a homogenizer, 75.00 g of silver fine particles (A-1), 3.82 g of a dispersing agent (C-1), and 183.91 g of a solvent (E-1) were subjected to a mixing treatment at 1,200 rpm for 30 minutes, and the mixed solution was dispersed using a mill type dispersion machine filled with zirconia beads to obtain a silver particle dispersion (A-1-2).

Preparation of Silver Fine Particle Dispersion (A-1-3)

Using a homogenizer, 85.00 g of silver fine particles (A-1), 4.3 g of a dispersing agent (C-1), and 208.4 g of a solvent (E-1) were subjected to a mixing treatment at 1,200 rpm for 30 minutes, and the mixed solution was dispersed using a mill type dispersion machine filled with zirconia beads to obtain a silver particle dispersion (A-1-3).

Preparation of Silver Fine Particle Dispersion (A-1-4)

Using a homogenizer, 70.00 g of silver fine particles (A-1), 3.34 g of a dispersing agent (C-1), and 171.13 g of a solvent (E-1) were subjected to a mixing treatment at 1,200 rpm for 30 minutes, and the mixed solution was dispersed using a mill type dispersion machine filled with zirconia beads to obtain a silver particle dispersion (A-1-4).

Preparation of Silver Fine Particle Dispersion (A-1-5)

Using a homogenizer, 88.00 g of silver fine particles (A-1), 2.61 g of a dispersing agent (C-1), and 211.42 g of a solvent (E-1) were subjected to a mixing treatment at 1,200 rpm for 30 minutes, and the mixed solution was dispersed using a mill type dispersion machine filled with zirconia beads to obtain a silver particle dispersion (A-1-5).

Preparation of Silver Fine Particle Dispersion (A-1-6)

Using a homogenizer, 65.00 g of silver fine particles (A-1), 3.32 g of a dispersing agent (C-1), and 159.41 g of a solvent (E-1) were subjected to a mixing treatment at 1,200 rpm for 30 minutes, and the mixed solution was dispersed using a mill type dispersion machine filled with zirconia beads to obtain a silver particle dispersion (A-1-6).

Preparation of Silver Fine Particle Dispersion (A-1-7)

Using a homogenizer, 93.00 g of silver fine particles (A-1), 2.61 g of a dispersing agent (C-1), and 223.09 g of a solvent (E-1) were subjected to a mixing treatment at 1,200 rpm for 30 minutes, and the mixed solution was dispersed using a mill type dispersion machine filled with zirconia beads to obtain a silver particle dispersion (A-1-7).

Preparation of Silver Fine Particle Dispersion (A-2-1)

Silver fine particles (A-2) (80.00 g), 4.06 g of a dispersing agent (C-1), and 196.14 g of a solvent (E-1) were treated in the same manner as in the silver fine particle dispersion (A-1-1), a silver fine particle dispersion (A-2-1) was prepared.

Preparation of Silver Fine Particle Dispersion (A-3-1)

Silver fine particles (A-3) (80.00 g), 4.06 g of a dispersing agent (C-1), and 196.14 g of a solvent (E-1) were treated in the same manner as in the silver fine particle dispersion (A-1-1), a silver fine particle dispersion (A-3-1) was prepared.

Preparation of Silver Fine Particle Dispersion (A-4-1)

Silver fine particles (A-4) (80.00 g), 4.06 g of a dispersing agent (C-1), and 196.1 g of a solvent (E-1) were treated in the same manner as in the silver fine particle dispersion (A-1-1), a silver fine particle dispersion (A-4-1) was prepared.

Preparation of Silver Fine Particle Dispersion (A-5-1)

Silver fine particles (A-5) (80.00 g), 4.06 g of a dispersing agent (C-1), and 196.1 g of a solvent (E-1) were treated in the same manner as in the silver fine particle dispersion (A-1-1), a silver fine particle dispersion (A-5-1) was prepared.

Preparation of Silver Fine Particle Dispersion (A-6-1)

Silver fine particles (A-6) (80.00 g), 4.06 g of a dispersing agent (C-1), and 196.1 g of a solvent (E-1) were treated in the same manner as in the silver fine particle dispersion (A-1-1), a silver fine particle dispersion (A-6-1) was prepared.

Preparation of Silver Fine Particle Dispersion (A-7-1)

Silver fine particles (A-7) (80.00 g), 4.06 g of a dispersing agent (C-1), and 196.1 g of a solvent (E-1) were treated in the same manner as in the silver fine particle dispersion (A-1-1), a silver fine particle dispersion (A-7-1) was prepared.

Preparation of Silver Fine Particle Dispersion (A-1-8)

Using a homogenizer, 80.00 g of silver fine particles (A-1), 4.06 g of a dispersing agent (C-1), and 196.14 g of a solvent (E-1) were subjected to a mixing treatment at 1,200 rpm for 30 minutes, and the mixed solution was dispersed using a mild dispersing machine NANO GETTER (Ashizawa Finetech Ltd.) to obtain a silver particle dispersion (A-1-8).

Preparation of Silver Fine Particle Dispersion (A-1-9)

Using a homogenizer, 75.00 g of silver fine particles (A-1), 3.82 g of a dispersing agent (C-1), and 183.91 g of a solvent (E-2) were subjected to a mixing treatment at 1,200 rpm for 30 minutes, and the mixed solution was dispersed using a media-less, high-pressure and wet-type pulverization machine NANOMIZER (NANOMIZER Inc.) to obtain a silver particle dispersion (A-1-9).

Preparation of Silver Fine Particle Dispersion (A-2-2)

Silver fine particles (A-2) (80.00 g), 4.06 g of a dispersing agent (C-2), and 196.14 g of a solvent (E-1) were treated in the same manner as in the silver fine particle dispersion (A-1-8), a silver fine particle dispersion (A-2-2) was prepared.

Preparation of Silver Fine Particle Dispersion (A-2-3)

Silver fine particles (A-2) (70 g), 3.34 g of a dispersing agent (C-2), and 171.13 g of a solvent (E-2) were treated in the same manner as in the silver fine particle dispersion (A-1-9), a silver fine particle dispersion (A-2-3) was prepared.

Preparation of Silver Fine Particle Dispersion (A-4-2)

Silver fine particles (A-4) (88.00 g), 2.61 g of a dispersing agent (C-2), and 211.42 g of a solvent (E-2) were treated in the same manner as in the silver fine particle dispersion (A-1-8), a silver fine particle dispersion (A-4-2) was prepared.

Preparation of Silver Fine Particle Dispersion (A-4-3)

Silver fine particles (A-4) (65.00 g), 3.32 g of a dispersing agent (C-1), and 159.41 g of a solvent (E-1) were treated in the same manner as in the silver fine particle dispersion (A-1-9), a silver fine particle dispersion (A-4-3) was prepared.

Preparation of Silver Fine Particle Dispersion (A-5-2)

Silver fine particles (A-5) (80.00 g), 4.06 g of a dispersing agent (C-1), and 196.14 g of a solvent (E-1) were treated in the same manner as in the silver fine particle dispersion (A-1-8), a silver fine particle dispersion (A-5-2) was prepared.

Preparation of Silver Fine Particle Dispersion (A-5-3)

Silver fine particles (A-5) (75.00 g), 3.82 g of a dispersing agent (C-1), and 183.91 g of a solvent (E-2) were treated in the same manner as in the silver fine particle dispersion (A-1-9), a silver fine particle dispersion (A-5-3) was prepared.

Compositions of the respective silver fine particle dispersions thus prepared are collectively shown in Tables 1 and 2.

TABLE 1

|  |  | Dispersion A-1-1 | Dispersion A-1-2 | Dispersion A-1-3 | Dispersion A-1-4 | Dispersion A-1-5 | Dispersion A-1-6 | Dispersion A-1-7 |
|---|---|---|---|---|---|---|---|---|
| Conductive fine particles (g) | (A-1) | 80.00 | 75.00 | 85.00 | 70.00 | 88.00 | 65.00 | 93.00 |
|  | (A-2) | — | — | — | — | — | — | — |
|  | (A-3) | — | — | — | — | — | — | — |
|  | (A-4) | — | — | — | — | — | — | — |
|  | (A-5) | — | — | — | — | — | — | — |
|  | (A-6) | — | — | — | — | — | — | — |
|  | (A-7) | — | — | — | — | — | — | — |
| Dispersing agent (g) | (C-1) | 4.06 | 3.82 | 43.0 | 3.34 | 2.61 | 33.2 | 26.1 |
| Solvent (g) | (E-1) | 196.14 | 183.91 | 208.40 | 171.13 | 211.42 | 159.41 | 223.09 |

|  |  | Dispersion A-2-1 | Dispersion A-3-1 | Dispersion A-4-1 | Dispersion A-5-1 | Dispersion A-6-1 | Dispersion A-7-1 |
|---|---|---|---|---|---|---|---|
| Conductive fine particles (g) | (A-1) | — | — | — | — | — | — |
|  | (A-2) | 80.00 | — | — | — | — | — |
|  | (A-3) | — | 80.00 | — | — | — | — |
|  | (A-4) | — | — | 80.00 | — | — | — |
|  | (A-5) | — | — | — | 80.00 | — | — |
|  | (A-6) | — | — | — | — | 80.00 | — |
|  | (A-7) | — | — | — | — | — | 80.00 |
| Dispersing agent (g) | (C-1) | 4.06 | 4.06 | 4.06 | 4.06 | 4.06 | 4.06 |
| Solvent (g) | (E-1) | 196.14 | 196.14 | 196.14 | 196.14 | 196.14 | 196.14 |

TABLE 2

|  |  | Dispersion A-1-8 | Dispersion A-1-9 | Dispersion A-2-2 | Dispersion A-2-3 |
|---|---|---|---|---|---|
| Conductive fine particles (g) | (A-1) | 80.00 | 75.00 | — | — |
|  | (A-2) | — | — | 80.00 | 70.00 |
|  | (A-3) | — | — | — | — |
|  | (A-4) | — | — | — | — |
|  | (A-5) | — | — | — | — |
|  | (A-6) | — | — | — | — |
|  | (A-7) | — | — | — | — |
| Dispersing agent (g) | (C-1) | 4.06 | 3.82 | — | — |
|  | (C-2) | — | — | 4.06 | 3.34 |
| Solvent (g) | (E-1) | 196.14 | — | 196.14 | — |
|  | (E-2) | — | 183.91 | — | 171.13 |

|  |  | Dispersion A-4-2 | Dispersion A-4-3 | Dispersion A-5-2 | Dispersion A-5-3 |
|---|---|---|---|---|---|
| Conductive fine particles (g) | (A-1) | — | — | — | — |
|  | (A-2) | — | — | — | — |
|  | (A-3) | — | — | — | — |
|  | (A-4) | 88.00 | 65.00 | — | — |
|  | (A-5) | — | — | 80.00 | 75.00 |
|  | (A-6) | — | — | — | — |
|  | (A-7) | — | — | — | — |
| Dispersing agent (g) | (C-1) | — | 33.2 | 40.6 | 3.82 |
|  | (C-2) | 2.61 | — | — | — |
| Solvent (g) | (E-1) | — | 159.41 | 196.14 | — |
|  | (E-2) | 211.42 | — | — | 183.91 |

(B) Alkali-Soluble Resin
Synthesis of Acid Dissociating Group-Containing Alkali-Soluble Resin Solution (B-1)

In a 500 mL flask, 2 g of 2,2'-azobis(isobutyronitrile) and 50 g of propylene glycol methyl ether acetate (PGMEA) were charged. Thereafter, 23.26 g of methacrylic acid, 31.46 g of benzyl methacrylate, and 32.80 g of dicyclopentanyl methacrylate were charged, followed by stirring at room temperature for a while. The flask was purged thoroughly with nitrogen by bubbling, followed by heating at 70° C. for 5 hours under stirring. To the solution thus obtained, 12.69 g of glycidyl methacrylate, 1 g of dimethylbenzylamine, 0.2 g of p-methoxyphenol, and 100 g of PGMEA were added, followed by heating at 90° C. for 4 hours under stirring to obtain an acrylic resin solution (B-1). To the acrylic resin solution (B-1) thus obtained, PGMEA was added so that the solid component concentration becomes 40% by mass. The acrylic resin (B-1) had a weight average molecular weight of 24,000.

Synthesis of Acid Dissociating Group-Containing Alkali-Soluble Resin Solution (B-2)

In a 500 mL flask, 2 g of 2,2'-azobis(isobutyronitrile) and 50 g of propylene glycol methyl ether acetate (PGMEA) were charged. Thereafter, 21.92 g of methacrylic acid, 29.90 g of benzyl methacrylate, and 31.18 g of dicyclopentanyl methacrylate were charged, followed by stirring at room temperature for a while. The flask was purged thoroughly with nitrogen by bubbling, followed by heating at 70° C. for 5 hours under stirring. To the solution thus obtained, 17.00 g of 4-(glycidyloxy)butyl acrylate, 1 g of dimethylbenzylamine, 0.2 g of p-methoxyphenol, and 100 g of PGMEA were added, followed by heating at 90° C. for 4 hours under stirring to obtain an acrylic resin solution (B-2). To the acrylic resin solution (B-2) thus obtained, PGMEA was added so that the solid component concentration becomes 40% by mass. The acrylic resin (B-2) had a weight average molecular weight of 23,000.

Synthesis of Acid Dissociating Group-Containing Alkali-Soluble Resin Solution (B-3) (Numerous Acid Dissociating Groups-1)

In a 500 mL flask, 2 g of 2,2'-azobis(isobutyronitrile) and 50 g of propylene glycol methyl ether acetate (PGMEA) were charged. Thereafter, 15.69 g of methacrylic acid, 69.12 g of benzyl methacrylate, and 48.65 g of dicyclopentanyl methacrylate were charged, followed by stirring at room temperature for a while. The flask was purged thoroughly with nitrogen by bubbling, followed by heating at 70° C. for 5 hours under stirring. To the solution thus obtained, 10.46 g of glycidyl methacrylate, 1 g of dimethylbenzylamine, 0.2 g of p-methoxyphenol, and 100 g of PGMEA were added, followed by heating at 90° C. for 4 hours under stirring to obtain an acrylic resin solution (B-3). To the acrylic resin solution (B-3) thus obtained, PGMEA was added so that the solid component concentration becomes 40% by mass. The acrylic resin (B-3) had a weight average molecular weight of 22,000.

Synthesis of Acid Dissociating Group-Containing Alkali-Soluble Resin Solution (B-4) (Numerous Acid Dissociating Groups-2)

In a 500 mL flask, 2 g of 2,2'-azobis(isobutyronitrile) and 50 g of propylene glycol methyl ether acetate (PGMEA) were charged. Thereafter, 6.68 g of methacrylic acid, 109.65 g of benzyl methacrylate, and 17.1 g of dicyclopentanyl methacrylate were charged, followed by stirring at room temperature for a while. The flask was purged thoroughly with nitrogen by bubbling, followed by heating at 70° C. for 5 hours under stirring. To the solution thus obtained, 5.51 g of glycidyl methacrylate, 1 g of dimethylbenzylamine, 0.2 g of p-methoxyphenol, and 100 g of PGMEA were added, followed by heating at 90° C. for 4 hours under stirring to obtain an acrylic resin solution (B-4). To the acrylic resin solution (B-4) thus obtained, PGMEA was added so that the solid component concentration becomes 40% by mass. The acrylic resin (B-4) had a weight average molecular weight of 22,000.

Synthesis of Acid Dissociating Group-Containing Alkali-Soluble Resin Solution (B-5) (Fewer Acid Dissociating Groups)

In a 500 mL flask, 2 g of 2,2'-azobis(isobutyronitrile) and 50 g of PGMEA were charged. Thereafter, 15.69 g of methacrylic acid, 9.16 g of benzyl methacrylate, and 48.65 g of dicyclopentanyl methacrylate were charged, followed by stirring at room temperature for a while. The flask was purged thoroughly with nitrogen by bubbling, followed by heating at 70° C. for 5 hours under stirring. To the solution thus obtained, 10.46 g of glycidyl methacrylate, 1 g of dimethylbenzylamine, 0.2 g of p-methoxyphenol, and 100 g of PGMEA were added, followed by heating at 90° C. for 4 hours under stirring to obtain an acrylic resin solution (B-5). To the acrylic resin solution (B-5) thus obtained, PGMEA was added so that the solid component concentration becomes 40% by mass. The acrylic resin (B-5) had a weight average molecular weight of 25,000.

Synthesis of Acid Dissociating Group-Containing Alkali-Soluble Resin Solution (B-6)

In a 500 mL flask, 2 g of 2,2'-azobis(isobutyronitrile) and 50 g of propylene glycol methyl ether acetate (PGMEA) were charged. Thereafter, 23.26 g of methacrylic acid, 25.6 g of tert-butyl methacrylate, and 32.80 g of dicyclopentanyl methacrylate were charged, followed by stirring at room temperature for a while. The flask was purged thoroughly with nitrogen by bubbling, followed by heating at 70° C. for 5 hours under stirring. To the solution thus obtained, 12.69 g of glycidyl methacrylate, 1 g of dimethylbenzylamine, 0.2 g of p-methoxyphenol, and 100 g of PGMEA were added, followed by heating at 90° C. for 4 hours under stirring to obtain an acrylic resin solution (B-6). To the acrylic resin solution (B-6) thus obtained, PGMEA was added so that the solid component concentration becomes 40% by mass. The acrylic resin (B-6) had a weight average molecular weight of 24,000.

Synthesis of Alkali-Soluble Resin Solution (B-7) which has Radical Polymerizable Group and has No Acid Dissociating Group (No Acid Dissociating Group)

In a 500 mL flask, 2 g of 2,2'-azobis(isobutyronitrile) and 50 g of PGMEA were charged. Thereafter, 15.69 g of methacrylic acid, 37.45 g of styrene, and 46.86 g of dicyclopentanyl methacrylate were charged, followed by stirring at room temperature for a while. The flask was purged thoroughly with nitrogen by bubbling, followed by heating at 70° C. for 5 hours under stirring. To the solution thus obtained, 10.46 g of glycidyl methacrylate, 1 g of dimethylbenzylamine, 0.2 g of p-methoxyphenol, and 100 g of PGMEA were added, followed by heating at 90° C. for 4 hours under stirring to obtain an acrylic resin solution (B-7). To the acrylic resin solution (B-7) thus obtained, PGMEA was added so that the solid component concentration becomes 40% by mass. The acrylic resin (B-7) had a weight average molecular weight of 25,000.

Synthesis of Acid Dissociating Group-Containing Alkali-Soluble Resin Solution (B-8) (Fewer Acid Dissociating Groups)

In a 500 mL flask, 2 g of 2,2'-azobis(isobutyronitrile) and 50 g of PGMEA were charged. Thereafter, 15.69 g of methacrylic acid, 3.88 g of benzyl methacrylate, and 48.65 g of dicyclopentanyl methacrylate were charged, followed by stirring at room temperature for a while. The flask was purged thoroughly with nitrogen by bubbling, followed by heating at 70° C. for 5 hours under stirring. To the solution thus obtained, 10.46 g of glycidyl methacrylate, 1 g of dimethylbenzylamine, 0.2 g of p-methoxyphenol, and 100 g of PGMEA were added, followed by heating at 90° C. for 4 hours under stirring to obtain an acrylic resin solution (B-8). To the acrylic resin solution (B-8) thus obtained, PGMEA was added so that the solid component concentration becomes 40% by mass. The acrylic resin (B-8) had a weight average molecular weight of 25,000.

Synthesis of Acid Dissociating Group-Containing Alkali-Soluble Resin Solution (B-9) (Numerous Acid Dissociating Groups-3)

In a 1,000 mL flask, 2 g of 2,2'-azobis(isobutyronitrile) and 100 g of propylene glycol methyl ether acetate (PGMEA) were charged. Thereafter, 6.68 g of methacrylic acid, 214.02 g of benzyl methacrylate, and 17.1 g of dicyclopentanyl methacrylate were charged, followed by stirring at room temperature for a while. The flask was purged thoroughly with nitrogen by bubbling, followed by heating at 70° C. for 5 hours under stirring. To the solution thus obtained, 5.51 g of glycidyl methacrylate, 1 g of dimethylbenzylamine, 0.2 g of p-methoxyphenol, and 100 g of PGMEA were added, followed by heating at 90° C. for 4 hours under stirring to obtain an acrylic resin solution (B-9). To the acrylic resin solution (B-9) thus obtained, PGMEA was added so that the solid component concentration becomes 40% by mass. The acrylic resin (B-9) has a weight average molecular weight of 22,000.

Composition of monomers of the respective alkali-soluble resins thus synthesized are collectively shown in Table 3.

(G) Sensitizer (G-1) 9,10-Diethoxyanthracene, 9,10-Dipropoxyanthracene (DPA; manufactured by Kawasaki Kasei Chemicals.)

(H) Acrylic Monomer (H-1) LIGHT ACRYLATE PE-4A (manufactured by Kyoeisha Chemical Co., Ltd.) (X) Pigment and/or Dye having Absorption in Visible Light Range (X-1-1) Pigment Dispersion Using a homogenizer, 80 g of PG58 ("FASTOGEN" (registered trademark) Green A110; manufactured by DIC Corporation), 4.06 g of a dispersing agent (C-1), and 84.06 g of a solvent (E-2) were subjected to a mixing treatment at 1,200 rpm for 30 minutes, and the mixed solution was dispersed using a mill type dispersion machine filled with zirconia beads to obtain a green dispersion (X-1-1) containing a solid component of 50% by mass (pigment concentration: 47.59% by mass).

(X-1-2) Pigment Dispersion

Using a homogenizer, 80 g of carbon black MA100 (particle diameter: 24 nm, manufactured by Mitsubishi Chemical Corporation), 4.06 g of a dispersing agent (C-2), and 84.06 g of a solvent (E-2) were subjected to a mixing treatment at 1,200 rpm for 30 minutes, and the mixed solution was dispersed using a mill type dispersion machine filled with zirconia beads to obtain a black dispersion (X-1-2) containing a solid component of 50% by mass (pigment concentration: 47.59% by mass).

(X-2-1) Dye Solution

Using a homogenizer, 84.06 g of Plast Blue 8540 (FS Blue1502; manufactured by Arimoto Chemical Co., Ltd.) and 84.06 g of a solvent (E-2) were dissolved by subjected to a mixing treatment at 1,200 rpm for 30 minutes to obtain a blue dye solution (X-2-1) containing a solid component of 50% by mass.

TABLE 3

| | Molecular | Alkali-soluble resin | | | | | | | | |
|---|---|---|---|---|---|---|---|---|---|---|
| Monomer | weight | (B-1) | (B-2) | (B-3) | (B-4) | (B-5) | (B-6) | (B-7) | (B-8) | (B-9) |
| Methacrylic acid (g) | 86.09 | 23.26 | 21.92 | 15.69 | 6.68 | 15.69 | 23.26 | 15.69 | 15.69 | 6.68 |
| (mol) | | (0.27) | (0.25) | (0.18) | (0.078) | (0.18) | (0.27) | (0.18) | (0.18) | (0.078) |
| Benzyl methacrylate (g) | 176.21 | 31.46 | 29.9 | 69.12 | 109.65 | 9.16 | — | — | 3.88 | 214.02 |
| (mol) | | (0.18) | (0.17) | (0.4) | (0.62) | (0.052) | | | (0.022) | (1.21) |
| Dicyclopentanyl methacrylate (g) | 220 | 32.8 | 31.18 | 48.65 | 17.1 | 48.65 | 32.8 | 46.86 | 48.65 | 17.1 |
| (mol) | | (0.15) | (0.14) | (0.22) | (0.078) | (0.22) | (0.15) | (0.21) | (0.22) | (0.078) |
| Glycidyl methacrylate (g) | 142 | 12.69 | — | 10.46 | 5.51 | 10.46 | 12.69 | 10.46 | 10.46 | 5.51 |
| (mol) | | (0.09) | | (0.07) | (0.039) | (0.07) | (0.09) | (0.07) | (0.07) | (0.039) |
| 4-(Glycidyloxy)butyl acrylate (g) | 200 | — | 17 | — | — | — | — | — | — | — |
| (mol) | | | (0.085) | | | | | | | |
| Tert-butyl methacrylate (g) | 142.2 | — | — | — | — | — | 25.6 | — | — | — |
| (mol) | | | | | | | (0.18) | | | |
| Styrene (g) | 104 | — | — | — | — | — | — | 37.45 | — | — |
| (mol) | | | | | | | | (0.36) | | |

(D) Photopolymerization Initiator (D-1) Irgacure OXE02 (oxime ester-based compound; manufactured by BASF) (F) Photo-Acid-Generating Agent and/or Thermal-Acid-Generating Agent (F-1) Triphenylsulfonium trifluoromethanesulfonate (onium salt-based photo-acid-generating agent; manufactured by Tokyo Chemical Industry Co., Ltd.)

(F-2) SI-100 (thermal-acid-generating agent; manufactured by SANSHIN CHEMICAL INDUSTRY CO., LTD.)

(X-2-2) Dye Solution

Using a homogenizer, 84.06 g of NUBIAN Black PA-2802 (manufactured by Orient Chemical Industries Co., Ltd.) and 84.06 g of a solvent (E-2) were dissolved by subjected to a mixing treatment at 1,200 rpm for 30 minutes to obtain a black dye solution (X-2-2) containing a solid component of 50% by mass.

The respective evaluation methods will be mentioned below.

Method of Evaluating Patterning Property

A method of evaluating the patterning property will be described by way of Example 1 as an example. First, 23.25 g of a solvent (E-2) and 7.31 g of a solvent (E-1) were added to those obtained by mixing 63.28 g of a silver fine particle dispersion (A-1-1) with 4.40 g of a 40% by mass alkali-soluble resin (B-1), 0.41 g of a photopolymerization initiator (D-2), and 1.30 g of an acrylic monomer (H-1), followed by stirring to prepare an ink 1.

Using a spin coater ("1H-360S (trade name)", manufactured by Mikasa Co., Ltd.), each ink was spin-coated on a non-alkali glass substrate (OA-10; manufactured by Nippon Electric Glass Company, Limited) by rotating at 500 rpm for 10 seconds, followed by rotating at 1,000 rpm for 4 seconds. Using a hot plate (SCW-636; manufactured by DAINIPPON SCREEN MFG. CO.), the coated substrate was pre-baked at 90° C. for 2 minutes to form a pre-baked film having a film thickness of 1 µm. Using PLA and an ultra-high pressure mercury lamp as a light source, the pre-baked film thus obtained was exposed through a gray scale mask for measurement of sensitivity at a gap of 100 µm. Thereafter, using an automatic developing apparatus (AD-2000; manufactured by Takizawa Sangyo Co., Ltd.), the film was shower-developed with an aqueous 0.045% by mass potassium hydroxide solution for 90 seconds, and then rinsed with water for 30 seconds.

After exposure and development, an exposure amount at which a 5 µm line-and-space patter is resolved at a width ratio of 1:1 (hereinafter referred to as an "optimal exposure amount") was used as the sensitivity. The exposure amount was measured by an I-line illuminometer. The amount of pigment residues between 5 µm line-and-space patters in the optimal exposure amount was also confirmed, and then three-grade evaluation (much residues, less residues, no residues) was performed.

A minimum pattern size in the optimal exposure amount after development was measured and was regarded as the resolution.

Method of Evaluating Volume Resistance

Using a spin coater ("1H-360S (trade name)", manufactured by Mikasa Co., Ltd.), the same ink as that used for evaluation of the patterning property was spin-coated on a non-alkali glass substrate by rotating at 500 rpm for 10 seconds, followed by rotating at 1,000 rpm for 4 seconds. Using a hot plate, the coated substrate was pre-baked at 90° C. for 2 minutes to form a pre-baked film having a film thickness of 1 µm. Using PLA and an ultra-high pressure mercury lamp as a light source, the pre-baked film thus obtained was exposed through a photomask having a rectangular translucent pattern (10 mm×15 mm) at a gap of 100 µm. Thereafter, using an automatic developing apparatus, the film was shower-developed with an aqueous 0.045% by mass potassium hydroxide solution for 90 seconds, and then rinsed with water for 30 seconds. Using an oven ("IHPS-222"; manufactured by ESPEC CORP.), the film was post-baked under the following three conditions to obtain a pattern for evaluation of volume resistance.

(1) In air at 230° C. for 30 minutes
(2) In air at 250° C. for 30 minutes
(3) In air at 280° C. for 30 minutes With respect to the rectangular pattern processed as mentioned above, surface resistivity ps (Ω/□) measured by a surface resistance measuring device (Loresta FP; manufactured by Mitsubishi Yuka Co., Ltd.) was multiplied by a film thickness t (cm) measured by a surface roughness shape analyzer (SURFCOM 1400D; manufactured by TOKYO SEIMITSU CO., LTD.) to thereby calculate a volume resistance value (µΩ·cm).

Method of Evaluating Reflectance

With respect to a rectangular pattern of a substrate subjected to post baking in air at 230° C. for 30 minutes among substrates produced by the method of evaluating the volume resistance, a reflectance at 450 nm was measured in SCI mode of a spectrophotometer (CM-2600d; manufactured by Konica Minolta, Inc.).

Example 1

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-1), 0.41 g of a photopolymerization initiator (D-1), and 1.30 g of an acrylic monomer (H-1), followed by stirring to prepare an ink 1. The content of silver fine particles relative to the total solid component of the ink 1 was 80% by mass.

Using the ink 1, the patterning property and volume resistance were evaluated by the above-mentioned methods. The results are shown in Table 4.

Example 2

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-2), 0.41 g of a photopolymerization initiator (D-2), and 1.30 g of an acrylic monomer (H-2), followed by stirring to prepare an ink 2. The content of silver fine particles relative to the total solid component of the ink 2 was 80% by mass. In the same manner as in Example 1, the patterning property and volume resistance were evaluated.

Example 3

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-3), 0.41 g of a photopolymerization initiator (D-1), and 1.30 g of an acrylic monomer (H-1), followed by stirring to prepare an ink 3. The content of silver fine particles relative to the total solid component of the ink 3 was 80% by mass. In the same manner as in Example 1, the patterning property and volume resistance were evaluated.

Example 4

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-4), 0.41 g of a photopolymerization initiator (D-1), and 1.30 g of an acrylic monomer (H-1), followed by stirring to prepare an ink 4. The content of silver fine particles relative to the total solid component of the ink 4 was 80% by mass. In the same manner as in Example 1, the patterning property and volume resistance were evaluated.

Example 5

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-5), 0.41 g of a photopolymerization initiator (D-1), and 1.30 g of an acrylic monomer (H-1), followed by stirring to prepare an ink 5. The content of silver fine particles relative to the total solid component of the ink 5 was 80% by mass. In the same manner as in Example 1, the patterning property and volume resistance were evaluated.

Example 6

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-6), 0.41 g of a photopolymerization initiator (D-1), and 1.30 g of an acrylic monomer (H-1), followed by stirring to prepare an ink 6. The content of silver fine particles relative to the total solid component of the ink 6 was 80% by mass. In the same manner as in Example 1, the patterning property and volume resistance were evaluated.

Example 7

A solvent (E-2) (23.25 g) and 7.31 g of a solvent (E-1) were added to those obtained by mixing 63.28 g of a silver fine particle dispersion (A-2-1) with 4.40 g of a 40% by mass alkali-soluble resin (B-1), 0.41 g of a photopolymerization initiator (D-1), and 1.30 g of an acrylic monomer (H-1), followed by stirring to prepare an ink 7. The content of silver fine particles relative to the total solid component of the ink 7 was 80% by mass. In the same manner as in Example 1, the patterning property and volume resistance were evaluated.

Example 8

A solvent (E-2) (23.25 g) and 7.31 g of a solvent (E-1) were added to those obtained by mixing 63.28 g of a silver fine particle dispersion (A-3-1) with 4.40 g of a 40% by mass alkali-soluble resin (B-1), 0.41 g of a photopolymerization initiator (D-1), and 1.30 g of an acrylic monomer (H-1), followed by stirring to prepare an ink 8. The content of silver fine particles relative to the total solid component of the ink 8 was 80% by mass. In the same manner as in Example 1, the patterning property and volume resistance were evaluated.

Example 9

A solvent (E-2) (23.25 g) and 7.31 g of a solvent (E-1) were added to those obtained by mixing 63.28 g of a silver fine particle dispersion (A-4-1) with 4.40 g of a 40% by mass alkali-soluble resin (B-1), 0.41 g of a photopolymerization initiator (D-1), and 1.30 g of an acrylic monomer (H-1), followed by stirring to prepare an ink 9. The content of silver fine particles relative to the total solid component of the ink 9 was 80% by mass. In the same manner as in Example 1, the patterning property and volume resistance were evaluated.

Example 10

A solvent (E-2) (23.25 g) and 7.31 g of a solvent (E-1) were added to those obtained by mixing 63.28 g of a silver fine particle dispersion (A-5-1) with 4.40 g of a 40% by mass alkali-soluble resin (B-1), 0.41 g of a photopolymerization initiator (D-1), and 1.30 g of an acrylic monomer (H-1), followed by stirring to prepare an ink 10. The content of silver fine particles relative to the total solid component of the ink 10 was 80% by mass. In the same manner as in Example 1, the patterning property and volume resistance were evaluated.

Example 11

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-1), 0.41 g of a photopolymerization initiator (D-1), 1.30 g of an acrylic monomer (H-1), and 0.05 g of a photo-acid-generating agent (F-1), followed by stirring to prepare an ink 11. The content of silver fine particles relative to the total solid component of the ink 11 was 80% by mass. In the same manner as in Example 1, the patterning property and volume resistance were evaluated.

Example 12

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-1), 0.41 g of a photopolymerization initiator (D-1), 1.30 g of an acrylic monomer (H-1), and 0.05 g of a photo-acid-generating agent (F-2), followed by stirring to prepare an ink 12. The content of silver fine particles relative to the total solid component of the ink 12 was 80% by mass. In the same manner as in Example 1, the patterning property and volume resistance were evaluated.

Example 13

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-1), 0.41 g of a photopolymerization initiator (D-1), 1.30 g of an acrylic monomer (11-1), 0.05 g of a photo-acid-generating agent (F-1), and 0.001 g of a sensitizer (G-1), followed by stirring to prepare an ink 13. The content of silver fine particles relative to the total solid component of the ink 13 was 80% by mass. In the same manner as in Example 1, the patterning property and volume resistance were evaluated.

Example 14

A solvent (E-2) (23.25 g) and 8.3 g of a solvent (E-1) were added to those obtained by mixing 59.33 g of a silver fine particle dispersion (A-1-2) with 7.37 g of a 40% by mass alkali-soluble resin (B-1), 0.41 g of a photopolymerization initiator (D-1), 1.30 g of an acrylic monomer (H-1), and 0.05 g of a photo-acid-generating agent (F-1), followed by stirring to prepare an ink 14. The content of silver fine particles relative to the total solid component of the ink 14 was 75% by mass. In the same manner as in Example 1, the patterning property and volume resistance were evaluated.

Example 15

A solvent (E-2) (23.25 g) and 5.34 g of a solvent (E-1) were added to those obtained by mixing 67.07 g of a silver fine particle dispersion (A-1-3) with 3.27 g of a 40% by mass alkali-soluble resin (B-1), 0.41 g of a photopolymerization initiator (D-1), 0.62 g of an acrylic monomer (H-1), and 0.05 g of a photo-acid-generating agent (F-1), followed by stirring to prepare an ink 15. The content of silver fine particles relative to the total solid component of the ink 15 was 85% by mass. In the same manner as in Example 1, the patterning property and volume resistance were evaluated.

Example 16

A solvent (E-2) (23.25 g) and 10.30 g of a solvent (E-1) were added to those obtained by mixing 55.47 g of a silver fine particle dispersion (A-1-4) with 8.54 g of a 40% by mass alkali-soluble resin (B-1), 0.41 g of a photopolymerization initiator (D-1), 1.98 g of an acrylic monomer (H-1), and 0.05 g of a photo-acid-generating agent (F-1), followed by stirring to prepare an ink 16. The content of silver fine particles relative to the total solid component of the ink 16 was 71% by mass. In the same manner as in Example 1, the patterning property and volume resistance were evaluated.

Example 17

A solvent (E-2) (23.25 g) and 4.89 g of a solvent (E-1) were added to those obtained by mixing 68.00 g of a silver fine particle dispersion (A-1-5) with 2.92 g of a 40% by mass alkali-soluble resin (B-1), 0.41 g of a photopolymerization initiator (D-1), 0.47 g of an acrylic monomer (H-1), and 0.05 g of a photo-acid-generating agent (F-1), followed by stirring to prepare an ink 17. The content of silver fine particles relative to the total solid component of the ink 17 was 88% by mass. In the same manner as in Example 1, the patterning property and volume resistance were evaluated.

Example 18

A solvent (E-2) (23.25 g) and 3.28 g of a solvent (E-1) were added to those obtained by mixing 71.65 g of a silver fine particle dispersion (A-1-7) with 1.37 g of a 40% by mass alkali-soluble resin (B-1), 0.49 g of a photopolymerization initiator (D-1), and 0.22 g of an acrylic monomer (H-1), followed by stirring to prepare an ink 18. The content of silver fine particles relative to the total solid component of the ink 18 was 92% by mass. In the same manner as in Example 1, the patterning property and volume resistance were evaluated.

Example 19

A solvent (E-2) (23.25 g) and 7.31 g of a solvent (E-1) were added to those obtained by mixing 63.28 g of a silver fine particle dispersion (A-7-1) with 4.40 g of a 40% by mass alkali-soluble resin (B-1), 0.41 g of a photopolymerization initiator (D-1), and 1.30 g of an acrylic monomer (H-1), followed by stirring to prepare an ink 19. The content of silver fine particles relative to the total solid component of the ink 19 was 80% by mass. In the same manner as in Example 1, the patterning property and volume resistance were evaluated.

Example 20

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-8), 0.41 g of a photopolymerization initiator (D-1), and 1.30 g of an acrylic monomer (H-1), followed by stirring to prepare an ink 20. The content of silver fine particles relative to the total solid component of the ink 20 was 80% by mass. In the same manner as in Example 1, the patterning property and volume resistance were evaluated.

Example 21

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-9), 0.41 g of a photopolymerization initiator (D-1), and 1.30 g of an acrylic monomer (H-1), followed by stirring to prepare an ink 21. The content of silver fine particles relative to the total solid component of the ink 21 was 80% by mass. In the same manner as in Example 1, the patterning property and volume resistance were evaluated.

Example 22

A solvent (E-2) (23.25 g) and 11.92 g of a solvent (E-1) were added to those obtained by mixing 51.75 g of a silver fine particle dispersion (A-1-6) with 10.18 g of a 40% by mass alkali-soluble resin (B-1), 0.49 g of a photopolymerization initiator (D-1), and 2.37 g of an acrylic monomer (H-1), followed by stirring to prepare an ink 22. The content of silver fine particles relative to the total solid component of the ink 22 was 66% by mass. In the same manner as in Example 1, the patterning property and volume resistance were evaluated.

Example 23

A solvent (E-2) (22.20 g) and 7.31 g of a solvent (E-1) were added to those obtained by mixing 63.28 g of a silver fine particle dispersion (A-1-8) with 3.40 g of a 40% by mass alkali-soluble resin (B-1), 0.41 g of a photopolymerization initiator (D-1), 1.25 g of an acrylic monomer (H-1), 0.05 g of a photo-acid-generating agent (F-2), and 2.1 g of a pigment dispersion (X-1-1), followed by stirring to prepare an ink 23. The content of silver fine particles relative to the total solid component of the ink 23 was 78% by mass. In the same manner as in Example 1, the patterning property and volume resistance were evaluated.

Example 24

A solvent (E-2) (4.10 g) and 23.25 g of a solvent (E-1) were added to those obtained by mixing 59.33 g of a silver fine particle dispersion (A-1-9) with 4.22 g of a 40% by mass alkali-soluble resin (B-1), 0.41 g of a photopolymerization initiator (D-1), 0.30 g of an acrylic monomer (H-1), and 8.41 g of a pigment dispersion (X-1-2), followed by stirring to prepare an ink 24. The content of silver fine particles relative to the total solid component of the ink 24 was 69% by mass. In the same manner as in Example 1, the patterning property and volume resistance were evaluated.

Example 25

A solvent (E-2) (23.25 g) and 7.31 g of a solvent (E-1) were added to those obtained by mixing 63.28 g of a silver fine particle dispersion (A-2-2) with 4.40 g of a 40% by mass alkali-soluble resin (B-1), 0.41 g of a photopolymerization initiator (D-1), 1.30 g of an acrylic monomer (H-1), 0.05 g of a photo-acid-generating agent (F-1), and 0.001 g of a sensitizer (G-1), followed by stirring to prepare an ink 25. The content of silver fine particles relative to the total solid component of the ink 25 was 80% by mass. In the same manner as in Example 1, the patterning property and volume resistance were evaluated.

Example 26

A solvent (E-2) (8.30 g) and 23.25 g of a solvent (E-1) were added to those obtained by mixing 55.47 g of a silver fine particle dispersion (A-2-3) with 6.59 g of a 40% by mass alkali-soluble resin (B-1), 0.41 g of a photopolymerization initiator (D-1), 1.98 g of an acrylic monomer (H-1), and 4.0 g of a dye solution (X-2-1), followed by stirring to prepare an ink 26. The content of silver fine particles relative to the total solid component of the ink 26 was 67% by mass. In the same manner as in Example 1, the patterning property and volume resistance were evaluated.

Example 27

A solvent (E-2) (4.89 g) and 23.25 g of a solvent (E-1) were added to those obtained by mixing 68.00 g of a silver fine particle dispersion (A-4-2) with 2.97 g of a 40% by mass alkali-soluble resin (B-1), 0.41 g of a photopolymerization initiator (D-1), and 0.47 g of an acrylic monomer (H-1), followed by stirring to prepare an ink 27. The content of silver fine particles relative to the total solid component of the ink 27 was 87% by mass. In the same manner as in Example 1, the patterning property and volume resistance were evaluated.

Example 28

A solvent (E-2) (23.25 g) and 11.92 g of a solvent (E-1) were added to those obtained by mixing 51.75 g of a silver fine particle dispersion (A-4-3) with 10.18 g of a 40% by mass alkali-soluble resin (B-1), 0.49 g of a photopolymerization initiator (D-1), 2.37 g of an acrylic monomer (1-1-1), and 0.05 g of a photo-acid-generating agent (F-1), followed by stirring to prepare an ink 28. The content of silver fine particles relative to the total solid component of the ink 28 was 66% by mass. In the same manner as in Example 1, the patterning property and volume resistance were evaluated.

Example 29

A solvent (E-2) (23.25 g) and 7.31 g of a solvent (E-1) were added to those obtained by mixing 63.28 g of a silver fine particle dispersion (A-5-2) with 4.40 g of a 40% by mass alkali-soluble resin (B-1), 0.41 g of a photopolymerization initiator (D-1), and 1.30 g of an acrylic monomer (H-1), followed by stirring to prepare an ink 29. The content of silver fine particles relative to the total solid component of the ink 29 was 80% by mass. In the same manner as in Example 1, the patterning property and volume resistance were evaluated.

Example 30

A solvent (E-2) (8.30 g) and 23.25 g of a solvent (E-1) were added to those obtained by mixing 59.33 g of a silver fine particle dispersion (A-5-3) with 3.42 g of a 40% by mass alkali-soluble resin (B-1), 0.41 g of a photopolymerization initiator (D-1), 0.30 g of an acrylic monomer (H-1), and 10.0 g of a dye solution (X-2-2), followed by stirring to prepare an ink 30. The content of silver fine particles relative to the total solid component of the ink 30 was 68% by mass. In the same manner as in Example 1, the patterning property and volume resistance were evaluated.

Comparative Example 1

A solvent (E-2) (23.25 g) and 7.31 g of a solvent (E-1) were added to those obtained by mixing 63.28 g of a silver fine particle dispersion (A-6-1) with 4.40 g of a 40% by mass alkali-soluble resin (B-1), 0.41 g of a photopolymerization initiator (D-1), and 1.30 g of an acrylic monomer (H-1), followed by stirring to prepare an ink 31. The content of silver fine particles relative to the total solid component of the ink 31 was 80% by mass. In the same manner as in Example 1, the patterning property and volume resistance were evaluated.

Comparative Example 2

A solvent (E-2) (23.25 g) and 7.31 g of a solvent (E-1) were added to those obtained by mixing 63.28 g of a silver fine particle dispersion (A-1-1) with 4.40 g of a 40% by mass alkali-soluble resin (B-7), 0.41 g of a photopolymerization initiator (D-1), and 1.30 g of an acrylic monomer (H-1), followed by stirring to prepare an ink 32. The content of silver fine particles relative to the total solid component of the ink 32 was 80% by mass. In the same manner as in Example 1, the patterning property and volume resistance were evaluated.

The evaluation results of Examples 2 to 30 and Comparative Examples 1 and 2 are shown in Tables 4 to 7.

TABLE 4

| Example/Comparative Example No. | | Example 1 | Example 2 | Example 3 | Example 4 | Example 5 | Example 6 | Example 7 | Example 8 |
|---|---|---|---|---|---|---|---|---|---|
| Content of conductive particles relative to the whole solid component (% by weight) | | 80 | 80 | 80 | 80 | 80 | 80 | 80 | 80 |
| Fine particle dispersion (g) | | Dispersion A-1-1 | Dispersion A-1-1 | Dispersion A-1-1 | Dispersion A-1-1 | Dispersion A-1-1 | Dispersion A-1-1 | Dispersion A-2-1 | Dispersion A-3-1 |
| | | 63.28 | 63.28 | 63.28 | 63.28 | 63.28 | 63.28 | 63.28 | 63.28 |
| 40% Alkali-soluble resin (B) (g) | (B-1) | 4.40 | — | — | — | — | — | — | — |
| | (B-2) | — | 4.40 | — | — | — | — | — | — |
| | (B-3) | — | — | 4.40 | — | — | — | — | — |
| | (B-4) | — | — | — | 4.40 | — | — | — | — |
| | (B-5) | — | — | — | — | 4.40 | — | — | — |
| | (B-6) | — | — | — | — | — | 4.40 | — | — |
| | (B-7) | — | — | — | — | — | — | — | — |
| | (B-8) | — | — | — | — | — | — | — | — |
| | (B-9) | — | — | — | — | — | — | — | — |
| Photopolymerization agent (D) (g) | (D-1) | 0.41 | 0.41 | 0.41 | 0.41 | 0.41 | 0.41 | 0.41 | 0.41 |
| Photo-acid-generating agent (F) (g) | (F-1) | — | — | — | — | — | — | — | — |

TABLE 4-continued

| Example/Comparative Example No. | | | Example 1 | Example 2 | Example 3 | Example 4 | Example 5 | Example 6 | Example 7 | Example 8 |
|---|---|---|---|---|---|---|---|---|---|---|
| Thermal-acid-generating agent (F) (g) | (F-2) | | — | — | — | — | — | — | — | — |
| Sensitizer (G) (g) | (G-1) | | — | — | — | — | — | — | — | — |
| Acrylic monomer (H) (g) | (H-1) | | 0.30 | 0.30 | 0.30 | 0.30 | 0.30 | 0.30 | 0.30 | 0.30 |
| Pigment dispersion (X) (g) | (X-1-1) | | — | — | — | — | — | — | — | — |
| | (X-1-2) | | — | — | — | — | — | — | — | — |
| Dye solution (X) (g) | (X-2-2) | | — | — | — | — | — | — | — | — |
| Total solid component (g) | | | 22.45 | 22.45 | 22.45 | 22.45 | 22.45 | 22.45 | 22.45 | 22.45 |
| Solvent (E) (g) | (E-1) | | 7.31 | 7.31 | 7.31 | 7.31 | 7.31 | 7.31 | 7.31 | 7.31 |
| | (E-2) | | 23.25 | 23.25 | 23.25 | 23.25 | 23.25 | 23.25 | 23.25 | 23.25 |
| Total composition (g) | | | 99.95 | 99.95 | 99.95 | 99.95 | 99.95 | 99.95 | 99.95 | 99.95 |
| Evaluation results | Patterning property | Resolution | A (2 μm resolution) | A (2 μm resolution) | A (2 μm resolution) | A (2 μm resolution) | A (2 μm resolution) | A (2 μm resolution) | A (2 μm resolution) | B (10 μm resolution) |
| | | Development residues | Less residues | Less residues | Less residues | Less residues | Less residues | Less residues | Less residues | Less residues |
| | Curing in air at 230° C. for 30 minutes | Volume resistance value (μΩ · cm) | 200 | 200 | 150 | 100 | 400 | 200 | 120 | 800 |
| | Curing in air at 250° C. for 30 minutes | | 15 | 14 | 15 | 15 | 50 | 15 | 15 | 15 |
| | Curing in air at 280° C. for 30 minutes | | 15 | 14 | 15 | 15 | 50 | 15 | 15 | 15 |
| | Reflectance | (450 nm) | 25 | 25 | 25 | 25 | 25 | 25 | 25 | 25 |

TABLE 5

| Example/Comparative Example No. | | | Example 9 | Example 10 | Example 11 | Example 12 | Example 13 | Example 14 | Example 15 | Example 16 |
|---|---|---|---|---|---|---|---|---|---|---|
| Content of conductive particles relative to the whole solid component (% by weight) | | | 80 | 80 | 80 | 80 | 80 | 75 | 81 | 71 |
| Fine particle dispersion (g) | | | Dispersion A-4-1 | Dispersion A-5-1 | Dispersion A-1-1 | Dispersion A-1-1 | Dispersion A-1-1 | Dispersion A-1-2 | Dispersion A-2-3 | Dispersion A-3-4 |
| | | | 63.28 | 63.28 | 63.28 | 63.28 | 63.28 | 59.33 | 67.07 | 55.47 |
| 40% Alkali-soluble resin (B) (g) | (B-1) | | 4.40 | 4.40 | 4.40 | 4.40 | 4.40 | 7.37 | 3.27 | 8.54 |
| | (B-2) | | — | — | — | — | — | — | — | — |
| | (B-3) | | — | — | — | — | — | — | — | — |
| | (B-4) | | — | — | — | — | — | — | — | — |
| | (B-5) | | — | — | — | — | — | — | — | — |
| | (B-6) | | — | — | — | — | — | — | — | — |
| | (B-7) | | — | — | — | — | — | — | — | — |
| | (B-8) | | — | — | — | — | — | — | — | — |
| | (B-9) | | — | — | — | — | — | — | — | — |
| Photopolymerization agent (D) (g) | (D-1) | | 0.41 | 0.41 | 0.41 | 0.41 | 0.41 | 0.41 | 0.41 | 0.41 |
| Photo-acid-generating agent (F) (g) | (F-1) | | — | — | 0.05 | — | 0.05 | 0.05 | 0.05 | 0.05 |
| Thermal-acid-generating agent (F) (g) | (F-2) | | — | — | — | 0.05 | — | — | — | — |
| Sensitizer (G) (g) | (G-1) | | — | — | — | — | 0.001 | — | — | — |
| Acrylic monomer (H) (g) | (H-1) | | 0.30 | 0.30 | 0.30 | 0.30 | 0.30 | 0.30 | 0.62 | 1.98 |
| Pigment dispersion (X) (g) | (X-1-1) | | — | — | — | — | — | — | — | — |
| | (X-1-2) | | — | — | — | — | — | — | — | — |
| Dye solution (X) (g) | (X-2-1) | | — | — | — | — | — | — | — | — |
| | (X-2-2) | | — | — | — | — | — | — | — | — |
| Total solid component (g) | | | 22.45 | 22.45 | 22.50 | 22.50 | 22.51 | 22.51 | 22.51 | 22.50 |
| Solvent (E) (g) | (E-1) | | 7.31 | 7.31 | 7.31 | 7.31 | 7.31 | 8.30 | 5.34 | 10.30 |
| | (E-2) | | 23.25 | 23.25 | 23.25 | 23.25 | 23.25 | 23.25 | 23.25 | 23.25 |
| Total composition (g) | | | 99.95 | 99.95 | 100.00 | 100.00 | 100.00 | 100.01 | 100.01 | 100.00 |
| Evaluation results | Patterning property | Resolution | A (2 μm resolution) | A (2 μm resolution) | A (2 μM resolution) | A (2 μm resolution) | A (2 μm resolution) | A (2 μm resolution) | A (2 μm resolution) | A (2 μm resolution) |
| | | Development residues | Less | Less | Less | Less | Less | No | Much | No |
| | Curing in air at 230° C. for | Volume resistance | | | | | | | | |

TABLE 5-continued

| Example/Comparative Example No. | | Example 9 | Example 10 | Example 11 | Example 12 | Example 13 | Example 14 | Example 15 | Example 16 |
|---|---|---|---|---|---|---|---|---|---|
| 30 minutes Curing in air at 250° C. for 30 minutes | value (μΩ · cm) | 20 | 10 | 100 | 100 | 100 | 200 | 150 | 800 |
| Curing in air at 280° C. for 30 minutes | | 10 | 10 | 15 | 15 | 15 | 15 | 12 | 200 |
| 30 minutes | | 10 | 10 | 15 | 15 | 15 | 15 | 12 | 50 |
| Reflectance | (450 nm) | 25 | 25 | 25 | 25 | 25 | 23 | 27 | 20 |

TABLE 6

| Example/Comparative Example No. | | Example 17 | Example 18 | Example 19 | Example 20 | Example 21 | Example 22 | Example 23 | Example 24 |
|---|---|---|---|---|---|---|---|---|---|
| Content of conductive particles relative to the whole solid component (% by weight) | | 88 | 92 | 80 | 80 | 80 | 66 | 78 | 69 |
| Fine particle dispersion (g) | | Dispersion A-1-5 68.00 | Dispersion A-1-7 71.65 | Dispersion A-7-1 63.28 | Dispersion A-1-1 63.28 | Dispersion A-1-1 63.28 | Dispersion A-1-6 51.75 | Dispersion A-1-8 63.28 | Dispersion A-1-9 59.33 |
| 40% Alkali-soluble resin (B) (g) | (B-1) | 2.92 | 1.37 | 4.40 | — | — | 10.18 | 3.40 | 4.22 |
| | (B-2) | — | — | — | — | — | — | — | — |
| | (B-3) | — | — | — | — | — | — | — | — |
| | (B-4) | — | — | — | — | — | — | — | — |
| | (B-5) | — | — | — | — | — | — | — | — |
| | (B-6) | — | — | — | — | — | — | — | — |
| | (B-7) | — | — | — | — | — | — | — | — |
| | (B-8) | — | — | — | 4.40 | — | — | — | — |
| | (B-9) | — | — | — | — | 4.40 | — | — | — |
| Photopolymerization agent (D) (g) | (D-1) | 0.41 | 0.49 | 0.41 | 0.41 | 0.41 | 0.49 | 0.41 | 0.41 |
| Photo-acid-generating agent (F) (g) | (F-1) | 0.05 | — | — | — | — | 0.05 | — | — |
| Thermal-acid-generating agent (F) (g) | (F-2) | — | — | — | — | — | — | 0.05 | — |
| Sensitizer (G) (g) | (G-1) | — | — | — | — | — | — | — | — |
| Acrylic monomer (H) (g) | (H-1) | 0.47 | 0.22 | 1.30 | 1.30 | 1.30 | 2.37 | 1.25 | 0.30 |
| Pigment dispersion (X) (g) | (X-1-1) | — | — | — | — | — | — | 2.10 | — |
| | (X-1-2) | — | — | — | — | — | — | — | 8.41 |
| Dye solution (X) (g) | (X-2-1) | — | — | — | — | — | — | — | — |
| | (X-2-2) | — | — | — | — | — | — | — | — |
| Total solid component (g) | | 22.50 | 22.75 | 22.45 | 22.45 | 22.45 | 22.51 | 23.10 | 22.40 |
| Solvent (E) (g) | (E-1) | 4.89 | 3.28 | 7.31 | 7.31 | 7.31 | 11.92 | 73.1 | 23.25 |
| | (E-2) | 23.25 | 23.25 | 23.25 | 23.25 | 23.25 | 23.25 | 22.20 | 4.10 |
| Total composition (g) | | 99.99 | 100.26 | 99.95 | 99.95 | 99.95 | 100.01 | 100.00 | 100.00 |
| Evaluation results | Patterning property | Resolution | A (2 μm resolution) | B (5 μm resolution) | B (8 μm resolution) | A (2 μm resolution) | B (residues are likely to remain) | A (2 μm resolution) | A (1.5 μm resolution) | A (1.0 μm resolution) |
| | | Development residues | Much | Much | Less | Less | Less | No | No | No |
| Curing in air at 230° C. for 30 minutes | Volume resistance value | | 15 | 10 | >1,000 | 600 | 15 | >1,000 | 200 | 200 |
| Curing in air at 250° C. for 30 minutes | (μΩ · cm) | | 10 | 10 | 100 | 100 | 10 | >1,000 | 15 | 20 |
| Curing in air at 280° C. for 30 minutes | | | 10 | 10 | 50 | 100 | 10 | 400 | 15 | 15 |
| Reflectance | (450 nm) | | 30 | 34 | 25 | 25 | 25 | 18 | 20 | 14 |

TABLE 7

| Example/Comparative Example No. | Example 25 | Example 26 | Example 27 | Example 28 | Example 29 | Example 30 | Comparative Example 1 | Comparative Example 2 |
|---|---|---|---|---|---|---|---|---|
| Content of conductive particles relative to the whole solid component (% by weight) | 80 | 67 | 87 | 66 | 80 | 68 | 80 | 80 |

TABLE 7-continued

| Example/Comparative Example No. | | Example 25 | Example 26 | Example 27 | Example 28 | Example 29 | Example 30 | Comparative Example 1 | Comparative Example 2 |
|---|---|---|---|---|---|---|---|---|---|
| Fine particle dispersion (g) | | Dispersion A-2-2 | Dispersion A-2-3 | Dispersion A-4-2 | Dispersion A-4-3 | Dispersion A-5-2 | Dispersion A-5-3 | Dispersion A-6-1 | Dispersion A-1-1 |
| | | 63.28 | 55.47 | 68.00 | 51.75 | 63.28 | 59.33 | 63.28 | 63.28 |
| 40% Alkali-soluble resin (B) (g) | (B-1) | 4.40 | 6.59 | 2.97 | 10.18 | 4.40 | 3.42 | 4.40 | — |
| | (B-2) | — | — | — | — | — | — | — | — |
| | (B-3) | — | — | — | — | — | — | — | — |
| | (B-4) | — | — | — | — | — | — | — | — |
| | (B-5) | — | — | — | — | — | — | — | — |
| | (B-6) | — | — | — | — | — | — | — | — |
| | (B-7) | — | — | — | — | — | — | — | 4.40 |
| | (B-8) | — | — | — | — | — | — | — | — |
| | (B-9) | — | — | — | — | — | — | — | — |
| Photopolymerization agent (D) (g) | (D-1) | 0.41 | 0.41 | 0.41 | 0.49 | 0.41 | 0.41 | 0.41 | 0.41 |
| Photo-acid-generating agent (F) (g) | (F-1) | 0.05 | — | — | 0.05 | — | — | — | — |
| Thermal-acid-generating agent (F) (g) | (F-2) | — | — | — | — | — | — | — | — |
| Sensitizer (G) (g) | (G-1) | 0.001 | — | — | — | — | — | — | — |
| Acrylic monomer (H) (g) | (H-1) | 1.30 | 1.98 | 0.47 | 2.37 | 1.30 | 0.30 | 1.30 | 0.30 |
| Pigment dispersion (X) (g) | (X-1-1) | — | — | — | — | — | — | −0 | — |
| | (X-1-2) | — | — | — | — | — | — | — | — |
| Dye solution (X) (g) | (X-2-1) | — | 4.00 | — | — | — | — | — | — |
| | (X-2-2) | — | — | — | — | — | 10.00 | — | — |
| Total solid component (g) | | 22.51 | 22.67 | 21.17 | 22.51 | 22.45 | 24.88 | 22.45 | 22.45 |
| Solvent (E) (g) | (E-1) | 7.31 | 23.25 | 23.25 | 11.92 | 7.31 | 23.25 | 7.31 | 7.31 |
| | (E-2) | 23.25 | 8.30 | 4.89 | 23.25 | 23.25 | 3.30 | 23.25 | 23.25 |
| Total composition (g) | | 100.00 | 100.00 | 99.99 | 100.01 | 99.95 | 100.01 | 99.95 | 99.95 |
| Evaluation results | Patterning property | Resolution | A (2 μm resolution) | A (2 μm resolution) | A (2 μm resolution) | A (2 μm resolution) | A (2 μm resolution) | A (1.5 μm resolution) | C (impossible to form pattern) | A (2 μm resolution) |
| | | Development residues | No | No | No | No | No | No | — | Less |
| | Curing in air at 230° C. for 30 minutes | Volume resistance value (μΩ · cm) | 100 | 480 | 15 | >1,000 | 10 | 150 | 15 | >1,000 |
| | Curing in air at 250° C. for 30 minutes | | 15 | 120 | 10 | >1,000 | 10 | 20 | 15 | >1,000 |
| | Curing in air at 280° C. for 30 minutes | | 15 | 30 | 10 | 300 | 10 | 10 | 15 | >1,000 |
| | Reflectance | (450 nm) | 25 | 18 | 30 | 18 | 25 | 18 | 30 | 25 |

The invention claimed is:

1. A photosensitive resin composition comprising:
   (A) conductive fine particles whose surfaces are coated with a surface coating layer comprising an elemental carbon, and
   (B) an alkali-soluble resin having an acid dissociating group.

2. The photosensitive resin composition according to claim 1, wherein the alkali-soluble resin having an acid dissociating group (B) further has a radical polymerizable group.

3. The photosensitive resin composition according to claim 2, having, as the radical polymerizable group, a (meth)acryloyl group.

4. The photosensitive resin composition according to claim 1, wherein the acid dissociating group is an organic group having 4 to 15 carbon atoms.

5. The photosensitive resin composition according to claim 1, further comprising:
   (F) a photo-acid-generating agent and/or a thermal-acid-generating agent.

6. The photosensitive resin composition according to claim 1, further comprising:
   (X) a pigment and/or a dye having an absorption in a visible light range.

7. The photosensitive resin composition according to claim 1, which includes, as the alkali-soluble resin having an acid dissociating group (B), an alkali-soluble resin obtained by radical copolymerization of 20 to 80 mol % of a compound having an acid dissociating group.

8. The photosensitive resin composition according to claim 1, wherein the conductive fine particles are silver fine particles.

9. The photosensitive resin composition according to claim 1, wherein the conductive fine particles have a particle diameter of 10 to 100 nm.

10. The photosensitive resin composition according to claim 1, wherein the surface coating layer has an average thickness of 0.1 to 10 nm.

11. The photosensitive resin composition according to claim 1, which includes the conductive fine particles whose surfaces are coated with the surface coating layer in an amount of 70 to 95% by mass based on the total solid component.

12. A method of manufacturing a conductive pattern comprising:
   coating a substrate surface with the photosensitive resin composition according to claim 1,
   drying the substrate coated with the photosensitive resin composition, exposing and developing the substrate coated with the photosensitive resin composition to form a pattern, and post-baking the pattern.

13. A substrate comprising the conductive pattern according to claim 12.

14. The substrate according to claim 13, wherein the conductive pattern has a width of 5 μm or less.

15. An element comprising the substrate according to claim 13.

16. A touch panel comprising the substrate according to claim 13.

17. An image sensor comprising the substrate according to claim 13.

* * * * *